United States Patent
Behzad

(10) Patent No.: US 7,421,254 B2
(45) Date of Patent: Sep. 2, 2008

(54) HIGH LINEARITY, HIGH EFFICIENCY POWER AMPLIFIER WITH DSP ASSISTED LINEARITY OPTIMIZATION

(75) Inventor: Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 393 days.

(21) Appl. No.: 10/819,016

(22) Filed: Apr. 6, 2004

(65) Prior Publication Data

US 2005/0090209 A1    Apr. 28, 2005

Related U.S. Application Data

(60) Provisional application No. 60/513,799, filed on Oct. 23, 2003.

(51) Int. Cl.
*H03C 1/62* (2006.01)
(52) U.S. Cl. .............. 455/115.1; 455/115.3; 455/127.1; 455/127.2; 455/127.5; 455/69; 375/345; 375/312; 330/253; 330/311
(58) Field of Classification Search ... 455/115.1–115.4, 455/67.11, 67.14, 226.1, 226.2, 24, 69, 126, 455/116, 127.1–127.2, 127.5, 78, 89, 343, 455/70; 375/219, 345, 295, 312; 330/253, 330/255, 311, 129, 75, 85, 96, 97, 278, 285
See application file for complete search history.

(56) References Cited

U.S. PATENT DOCUMENTS

| | | | | |
|---|---|---|---|---|
| 4,246,535 A | * | 1/1981 | Huang et al. | 324/602 |
| 4,520,324 A | * | 5/1985 | Jett et al. | 330/285 |
| 5,103,281 A | * | 4/1992 | Holloway | 257/370 |
| 5,942,946 A | * | 8/1999 | Su et al. | 330/310 |
| 6,282,177 B1 | * | 8/2001 | Ostermiller et al. | 370/278 |
| 6,404,823 B1 | | 6/2002 | Grange et al. | |
| 6,492,872 B1 | * | 12/2002 | Fujioka et al. | 330/285 |
| 6,496,067 B1 | * | 12/2002 | Behzad et al. | 330/261 |
| 6,515,547 B2 | * | 2/2003 | Sowlati | 330/311 |
| 6,577,677 B1 | * | 6/2003 | Hara | 375/219 |
| 6,756,847 B2 | * | 6/2004 | Blecker et al. | 330/253 |
| 6,795,693 B2 | * | 9/2004 | Balech | 455/115.1 |
| 6,819,184 B2 | * | 11/2004 | Pengelly et al. | 330/295 |

(Continued)

FOREIGN PATENT DOCUMENTS

GB    2 345 211    6/2000

*Primary Examiner*—Edward Urban
*Assistant Examiner*—Junpeng Chen
(74) *Attorney, Agent, or Firm*—Garlick Harrison & Markison

(57) ABSTRACT

A communications transceiver includes a baseband processor, a receiver section, and a transmitter section that includes a power amplifier. The receiver and transmitter sections communicatively couple to the baseband processor. In a calibration operation, the baseband processor produces a test signal to the transmitter section. Further, the baseband processor causes each of a plurality of power amplifier bias settings to be applied to the power amplifier. For each of the plurality of power amplifier bias settings, the power amplifier produces an amplified test signal, the receiver section couples back a portion of the amplified test signal to the baseband processor, and the baseband processor produces a characterization of the amplified test signal respective. Based upon a plurality of characterizations of the amplified test signal and respective power amplifier bias settings, the baseband processor determines power amplifier bias control settings. The baseband processor then applies the power amplifier bias control settings to the power amplifier.

18 Claims, 21 Drawing Sheets

U.S. PATENT DOCUMENTS

| | | | |
|---|---|---|---|
| 6,834,182 B2 * | 12/2004 | Fu .......................... | 455/115.1 |
| 6,850,120 B2 * | 2/2005 | Heima et al. ................ | 330/311 |
| 6,995,616 B2 * | 2/2006 | Behzad et al. .............. | 330/311 |
| 7,113,744 B1 * | 9/2006 | Moloudi et al. ............... | 455/20 |
| 2003/0206057 A1 * | 11/2003 | Genest ...................... | 330/129 |
| 2005/0035820 A1 * | 2/2005 | Pessl .......................... | 330/255 |

* cited by examiner

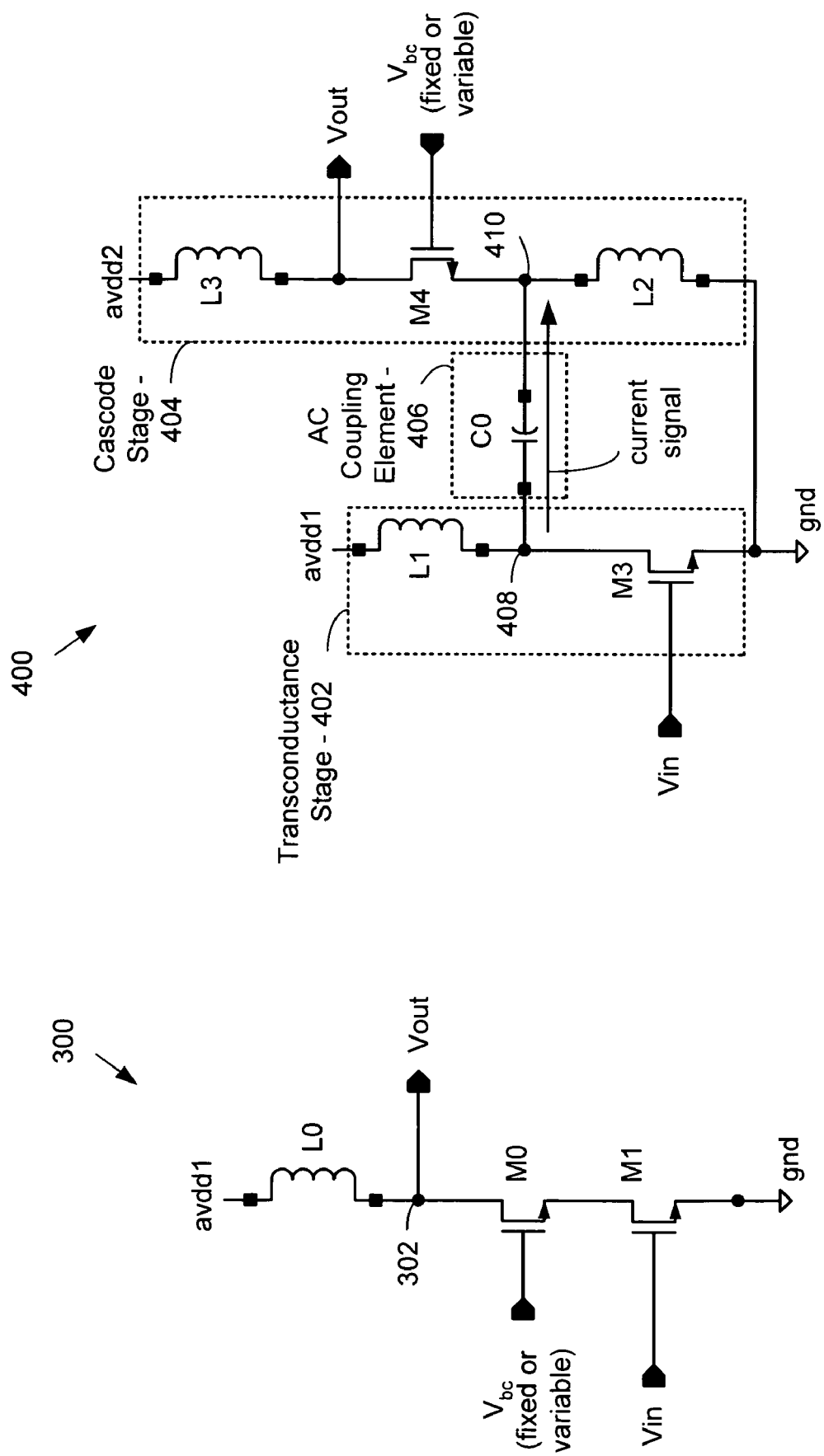

Power Amplifier 1100

HIGH LINEARITY, HIGH EFFICIENCY POWER AMPLIFIER WITH DSP ASSISTED LINEARITY OPTIMIZATION

CROSS REFERENCE TO RELATED APPLICATION

This application claims priority to U.S. Provisional Patent Application Ser. No. 60/513,799, filed Oct. 23, 2003, which is incorporated herein by reference for all purposes.

BACKGROUND

1. Technical Field

This invention relates generally to communication systems and more particularly to power amplifiers used in transmitters within such communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. Each wireless communication device participating in wireless communications includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more frequency conversion stages, and a power amplifier. The data modulation stage converts raw data into baseband signals in accordance with the particular wireless communication standard. The one or more frequency conversion stages mix the baseband signals with one or more local oscillations to produce RF signals. The power amplifier amplifies the RF signals prior to transmission via an antenna.

As compared/contrasted to the wireless communication device described above, a transmitter of a wired communication device includes a data modulation stage, the power amplifier and may include a frequency conversion stage that frequency converts a baseband signal produced by the data modulation stage to a transmit band. While power amplifiers of wired communication devices do not typically operate in the RF range, they have similar operational requirements. In both wired and wireless communication devices, the power amplifier is often required to provide a high swing at its output. The power amplifier must also be very linear in its operation and also use as little power as possible. These competing goals are very difficult to meet, particularly in portable devices that are battery powered and that operate at relatively low voltages.

BRIEF SUMMARY OF THE INVENTION

In order to overcome the above-described shortcomings, among others, a communications transceiver constructed according to the present invention includes a baseband processor, a receiver section, and a transmitter section that includes a power amplifier. The receiver and transmitter sections communicatively couple to the baseband processor. In a calibration operation, the baseband processor produces a test signal to the transmitter section. Further, the baseband processor causes each of a plurality of power amplifier bias settings to be applied to the power amplifier. For each of the plurality of power amplifier bias settings, the power amplifier produces an amplified test signal, the receiver section couples back a portion of the amplified test signal to the baseband processor, and the baseband processor produces a characterization of the amplified test signal respective. Based upon a plurality of characterizations of the amplified test signal and respective power amplifier bias settings, the baseband processor determines power amplifier bias control settings. The baseband processor then applies the power amplifier bias control settings to the power amplifier.

The power amplifier bias control settings may be determined during at least one of start up, reset, and idle periods of the communications transceiver. The power amplifier bias control settings may include a minimum bias setting, a maximum bias setting, and/or a relationship between input signal level and applied bias level.

In some constructs, the power amplifier includes a transconductance stage. In such case, the power amplifier bias control settings may include bias voltage level settings applied to the transconductance stage of the power amplifier. In some constructs of the power amplifier, the bias voltage level settings may include first bias voltage level settings applied to a primary portion of the transconductance stage and second bias voltage level settings applied to a secondary portion of the transconductance stage that couples in parallel with the primary portion of the transconductance stage.

In other constructs, the power amplifier includes a cascode stage. In such case, the power amplifier bias control settings may include bias voltage level settings applied to the cascode stage of the power amplifier. When the power amplifier includes both a transconductance stage and a cascode stage, the power amplifier bias control settings may include first bias settings to be applied to the transconductance stage of the power amplifier and second bias settings to be applied to the cascode stage of the power amplifier.

In still another construct, the power amplifier includes a cascode stage having a Metal Oxide Silicon (MOS) transistor and a corresponding parasitic bipolar junction transistor formed in parallel with the MOS transistor. With this construct, the power amplifier bias control settings may include first bias voltage level settings applied to a gate of the MOS transistor of the cascode stage of the power amplifier and second bias voltage level settings applied to a base of the parasitic bipolar transistor formed in parallel with the NMOS transistor of the cascode stage. With this power amplifier construct, in some operations the NMOS transistor is turned off by the first bias voltage level settings. Further, with this construct, in other operations the parasitic bipolar transistor is turned off by the second bias voltage level settings. Further still with this construct, in some operations the MOS transistor is turned on by the first bias voltage level settings and the parasitic bipolar transistor is turned on by the second bias voltage level settings.

In another embodiment, a baseband signal generator that produces the test signal to the baseband processor. In any embodiment, the test signal may be representative of a modulated signal to be produced by the communications transceiver during normal operations. The characterizations of the amplified test signal may indicate at least one of an error vector magnitude, an intermodulation distortion magnitude, or the 1 dB compression point of the amplified test signal.

Other features and advantages of the present invention will become apparent from the following detailed description of the invention made with reference to the accompanying drawings.

BRIEF DESCRIPTION OF THE DRAWINGS

FIG. 3 is a schematic diagram illustrating a singled ended cascode power amplifier;

FIG. 4 is a schematic diagram illustrating a single ended cascode power amplifier constructed according to the present invention;

DETAILED DESCRIPTION OF THE DRAWINGS

Figure 1:
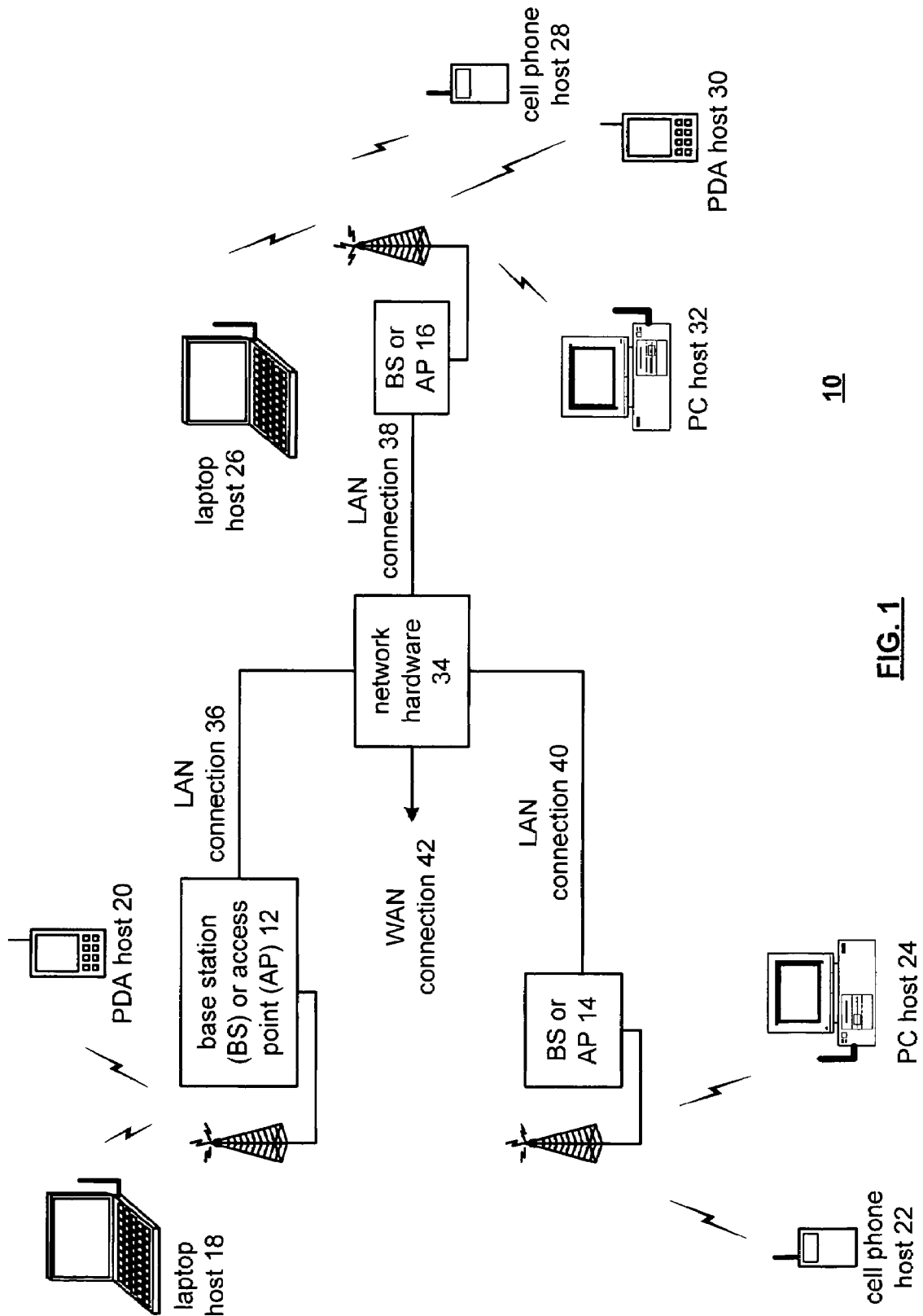
FIG. 1 is a schematic block diagram illustrating a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32, cellular telephone hosts 22 and 28, and/or any other type of device that supports wireless communications. The details of the wireless communication devices will be described with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers as disclosed herein to enhance performance, reduce costs, reduce size, and/or enhance broadband applications.

Figure 2:
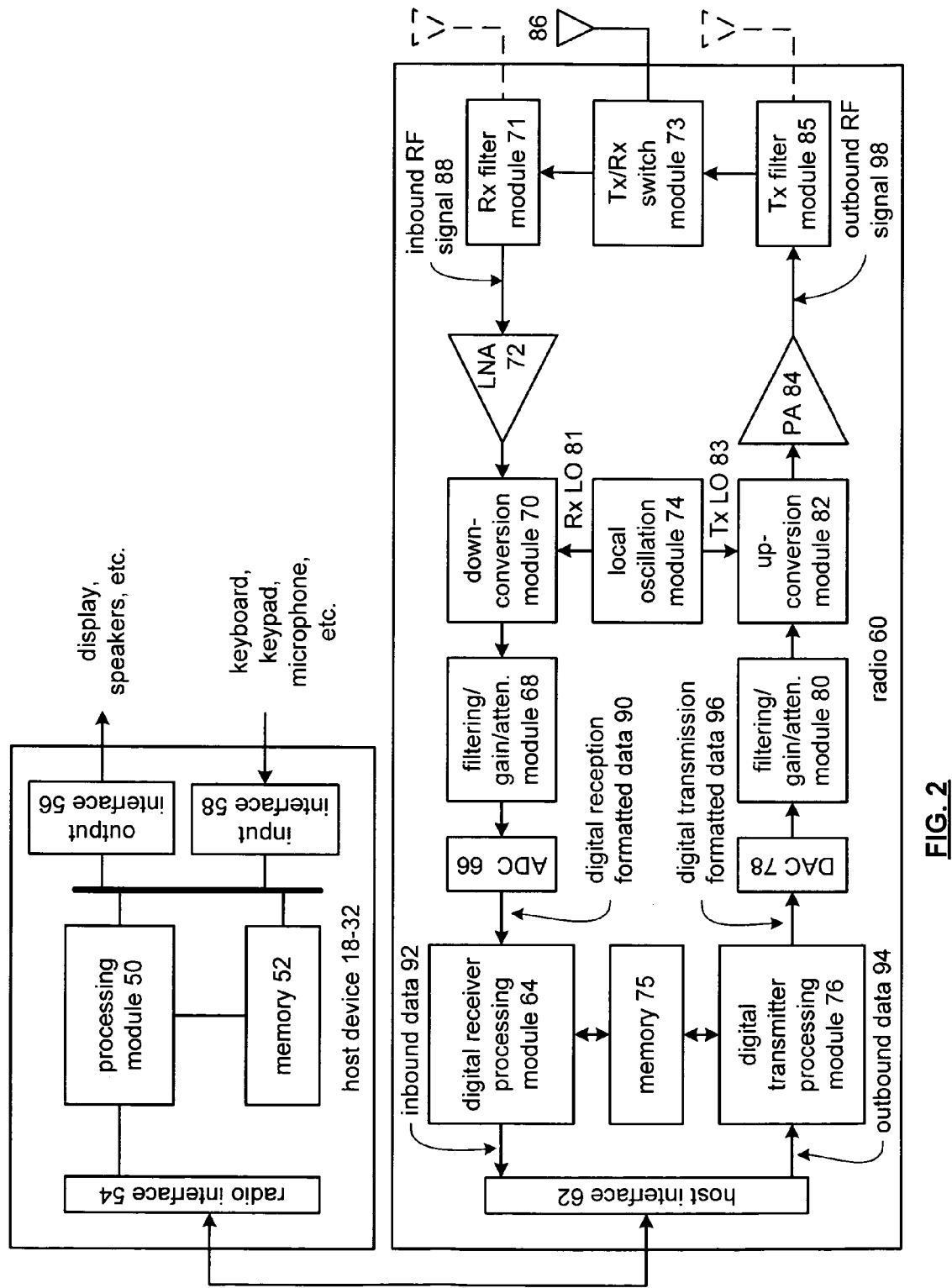
FIG. 2 is a schematic block diagram illustrating a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or may be an externally coupled component that couples to the host device 18-32 via a communication link, e.g., PCI interface, PCMCIA interface, USB interface, or another type of interface.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain/attenuation module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions that facilitate functionality of the device. In some embodiments, the combination of the digital receiver processing module, the digital transmitter processing module, and the memory 75 may be referred to together as a "baseband processor."

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, IEEE802.11g, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain/attenuation module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain/attenuation module 68. The filtering/gain/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

FIG. 3 is a schematic diagram illustrating a singled ended cascode power amplifier 300. The single ended cascode power amplifier 300 includes a transconductance stage having a transistor M1 that receives an input voltage signal and produces an current- signal through the transistor M1. Transistor M1 is biased in its active range by inductor L0 and the voltage drop across cascode transistor M0. The cascode transistor M0 is biased by the $V_{bc}$ voltage level to control the impedance at node 302. An output voltage at node 302 is a product of the current that passes through transistors M1 and M0 and the impedance at node 302.

Cascode amplifiers provide various advantages when used as power amplifiers in a transmitter, e.g., RF Power Amplifier 84 of FIG. 2, a power amplifier of a wired communication device, etc. One advantage to using a cascode amplifier as a power amplifier is so that a relatively high voltage supply avdd1 may be employed in combination with a fine-geometry, low-voltage, high-Gm device, i.e., transistor M1. In the configuration of FIG. 3, the cascode device M0 tolerates the high voltage swing at the node 302, and the low-voltage M1 transistor provides the transconductance or gain. In this way, the large Gm for a given bias current can be achieved and a large swing can be tolerated without damage to the low voltage device M1 transistor. The cascode transistor M0 also assist in reducing the Miller effect experienced by the transconductance transistor M1.

The cascode configuration provides additional benefits as well. The cascode power amplifier 300 provides excellent input/output isolation to reduce or eliminate oscillations between the input side of the amplifier and the output side of the amplifier. Such isolation assists in facilitating proper tuning of the amplifier as well as circuits on the input side and the output side of the amplifier.

The cascode power amplifier 300 of FIG. 3, however does not allow for maximum possible headroom. "$V_{bc}$" has to be tied to a bias line in such a way that transistor M1 has sufficient $V_{ds}$ drop so that it may provide reasonably high Gm and reasonably high output impedance ($R_O$). Further, $V_{bc}$ must be low enough so that the cascode device M0 has enough $V_{ds}$ drop so that it does not suffer from low and signal dependent output impedance and a resulting loss of gain and linearity.

According to one construct of the cascode amplifier 300 of FIG. 3, cascode transistor M0 has a relatively thicker gate oxide and/or a relatively longer channel than does the fine-geometry, low-voltage, high-Gm transistor M1. With its thick oxide/long channel, cascode transistor M0 is less prone to gate oxide damage and avalanche breakdown in its high voltage swing operation. Due to its construct, fine-geometry, low-voltage, high-Gm transistor M1 provides gain required by the transconductance stage of the cascode amplifier 300. Because fine-geometry, low-voltage, high-Gm transistor M1 is subject to less voltage than is the thick oxide/long channel cascode transistor M0, it can have the finer geometry without risking its gate integrity. With this particular construct, the cascode amplifier 300 has a larger Gm for a given bias current (due to the fine-geometry transistor M1) while the cascode transistor M0 protects the fine-geometry transistor M1 from damage.

In one particular construct, the thick oxide/long channel cascode transistor M0 has a channel length on the order of 0.35 microns and a gate oxide thickness on the order of 100 Angstroms while the fine-geometry, low-voltage, high-Gm transistor M1 has a channel length on the order of 0.18 microns and a gate oxide thicknesses on the order of 500 Angstroms. These dimensions are one example only that is intended to show relative thicknesses and lengths of the corresponding transistor components.

As will be described further with reference to FIGS. 4, 5, 6, 10A, and 11, the use of differing transistor dimensions for transconductance stage transistors and cascode stage transistors may be employed with various cascode amplifier structures. The technique may be employed with a standard singled ended cascode amplifier (FIG. 3), a differential cascode amplifier, a pseudo-differential cascode amplifier, and the other structures illustrated in the following FIGS. The voltage on the gate of the cascode can be tied to a fixed voltage or made programmable for optimal tradeoff between Vds on the Gm device versus the voltage across the transconductance device for linearity and overall gain.

FIG. 4 is a schematic diagram illustrating a single ended cascode power amplifier 400 constructed according to the present invention. The power amplifier includes a transconductance stage 402, a cascode stage 404, and an AC coupling element 406. The transconductance stage 402 receives an input voltage signal ($V_{in}$) and produces an output current signal. The transconductance stage 402 comprises a series combination of a linear transconductance element M3 and a circuit element L1 coupled between a transconductance voltage supply avdd1 and a ground. In the embodiment of FIG. 4, the linear transconductance element M3 comprises a transistor and the circuit element comprises an inductor L1. A first terminal of the inductor L1 couples to the transconductance voltage supply avdd1, a second terminal of the inductor couples to a drain of the transistor M3, a source of the transistor couples to a ground, and the input voltage signal Vin couples to a gate of the transistor M3. Thus, the inductor L1 is in series with the source and drain terminals of the transistor M3. The transistor M3 may be one of a metal oxide silicon field effect (MOSFET) transistor, a field effect transistor, and a bipolar junction transistor, and is a MOSFET in the illustrated embodiment.

The AC coupling element 406 couples between the transconductance stage 402 and the cascode stage 404 and AC couples the output current signal of the transconductance stage 402 produced at node 408 as the input current signal of the cascode stage 404 at node 410. In the illustrated embodiment, the AC coupling element 406 is a capacitor.

The cascode stage 404 is adapted to receive an input current signal at node 410 and to produce an output voltage signal Vout. In the illustrated embodiment, the cascode stage includes a series combination of a first circuit element (inductor L3), source and drain terminals of a transistor M4, and a second circuit element (inductor L2), the series combination biased between a cascode voltage supply avdd2 and a ground. A gate of the transistor M4 is adapted to receive a controllable cascode bias voltage $V_{bc}$. As will be described further with reference to FIGS. 6 and 7, in some embodiments, $V_{bc}$ is varied depending upon the operating conditions of the transmitter serviced by the power amplifier 400. In other embodiments, $V_{bc}$ is fixed.

In operation, Vout has an operational range extending from less than ground to greater than the cascode supply voltage avdd2. The transconductance stage 402 and the cascode stage 404 may be powered at differing voltage supply levels, e.g., avdd2<avdd1, or may be powered at a common voltage supply level, e.g., avdd2=avdd1.

With the cascode amplifier 400 of FIG. 4, the transconductance stage 402 is effectively decoupled from the cascode stage 404 by the AC coupling element 406 (capacitor C0) and inductors L1 and L2. Inductors L1 and L2 may be large enough to act as a choke or, alternately, may be chosen to resonate out load capacitances at their respective nodes. Either way the signal current flows through the C0 cap and through M4 and to the load inductor L3. With this scheme, not only can the output voltage Vout swing above cascode supply voltage avdd2, but also the source of the M4 cascode device can swing below ground (gnd) providing a very large possible swing across the M4 device. Since M3 is a low voltage device, it can be fed from the lower voltage supply avdd1 (e.g. 1.8V) while the cascode stage 404 can be fed from a higher voltage supply avdd2 (e.g. 3.3V) for maximum possible swing.

For power amplifiers, maximum swing is desirable. Lower swing can typically be tolerated if high-ratio impedance transformers are used but such transformers are typically either not available at frequencies or lossy. The power consumption of the circuit of FIG. 4 is more than that of FIG. 3 for the same gain level. However, the circuit of FIG. 4 produces output power levels that cannot be achieved by the circuit of FIG. 3.

Cascode transistor M4 may have a relatively thicker gate oxide and relatively longer channel than does a fine-geometry, low-voltage, high-Gm transistor M3. With this construct, as was the case with the amplifier of FIG. 3, the cascode transistor M4 is less prone to gate oxide damage and avalanche breakdown in its high voltage swing operation while the fine-geometry, low-voltage, high-Gm transistor M3 provides the gain required for the transconductance stage of the amplifier. In one particular embodiment, the thick oxide/long channel cascode transistor M4 has a channel length on the order of 0.35 microns and a gate oxide thickness on the order of 100 Angstroms while the fine-geometry, low-voltage, high-Gm transistor M3 has a channel length on the order of 0.18 microns and a gate oxide thickness on the order of 500 Angstroms. The relative dimensions of transistors M3 and M4 may be similar for smaller or larger transistors.

Figure 5:
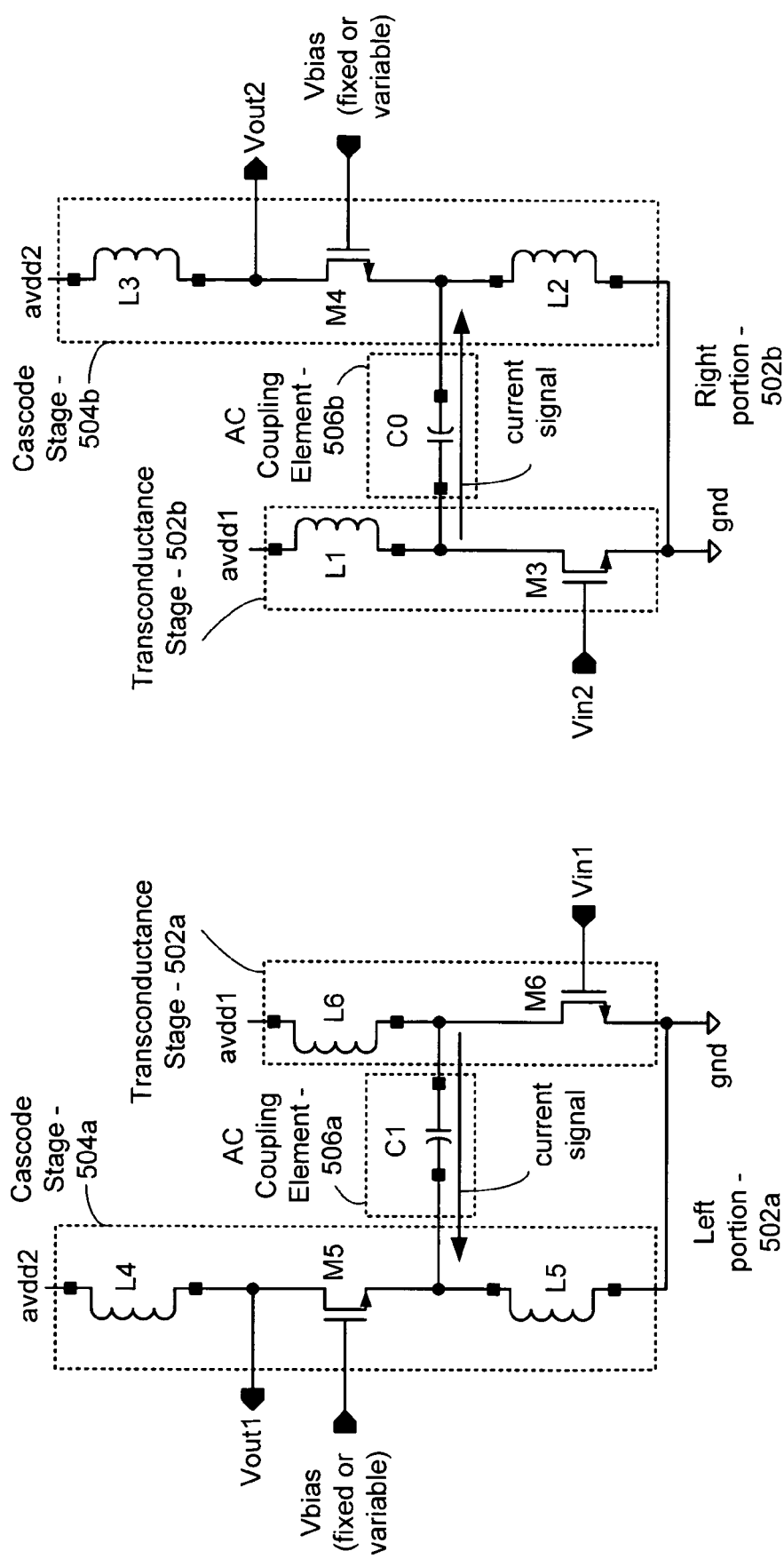
FIG. 5 is a schematic diagram illustrating a differential cascode power amplifier constructed according to the present invention.

FIG. 5 is a schematic diagram illustrating a differential cascode power amplifier 500 constructed according to the present invention. The differential power amplifier 500 includes a differential transconductance stage (502a and 502b), a differential cascode stage (504a and 504b), and a differential AC coupling element (506a and 506b). The differential transconductance stage (502a and 502b) is adapted to receive a differential input voltage signal (Vin1 and Vin2) and to produce a differential output current signal. The differential cascode stage (504a and 504b) is adapted to receive a differential input current signal and to produce a differential output voltage signal (Vout1 and Vout2). The differential AC coupling element (506a and 506b) couples between the differential transconductance stage (502a and 502b) and the differential cascode stage (504a and 504b) and operates to AC couple the differential output current signal of the differential transconductance stage (402a and 402b) as the differential input current signal of the differential cascode stage. In the illustrated embodiment, each AC coupling element 506a and 506b of the differential AC coupling element is a capacitor. In operation, the differential output voltage signal is amplified with respect to the differential input voltage signal.

Each portion of the differential transconductance stage 502a (502b) includes a series combination of a linear transconductance element M3 (M6) and a circuit element L1 (L6) coupled between a transconductance voltage supply avdd1 and a ground. In the illustrated embodiment, each linear transconductance element comprises a transistor M3 (M6) and each circuit element comprises an inductor L1 (L6). As illustrated, for each series combination, the inductor is in series with source and drain terminals of the corresponding transistor.

Each portion of the differential cascode stage 504a (504b) comprises a series combination of a first inductor L3 (L4), a transistor M4 (M5), and a second inductor L2 (L5) biased between a cascode voltage supply avdd2 and a ground. In this structure, for each portion of the differential cascode stage 504a (504b), gates of each transistor M4 (M5) are adapted to receive a controllable cascode bias voltage. Further, the differential transconductance stage 502a and 502b and the differential cascode stage 504 and 504b may be powered at differing voltage levels. Alternately, the differential transconductance stage 502a and 502b and the differential cascode stage 504 and 504b may be powered at a common voltage level. As illustrated inductors L2 (L5) and L3 (L4) are in series with source and drain terminals of transistor M4 (M5) such that the series combination of these elements couples between the cascode voltage supply avdd2 and ground.

Cascode transistors M4 and M5 may have relatively thicker gate oxides and relatively longer channels than fine-geometry, low-voltage, high-Gm transistors M3 and M6. The thick oxide/long channel cascode transistors M4 and M5 are less prone to gate oxide damage and avalanche breakdown in their high voltage swing operation within the amplifier. The fine-geometry, low-voltage, high-Gm transistors M3 and M6 provide the accuracy required for the transconductance stage of the amplifier. Other advantages for this construct were previously described with reference to FIG. 3.

Figure 6:
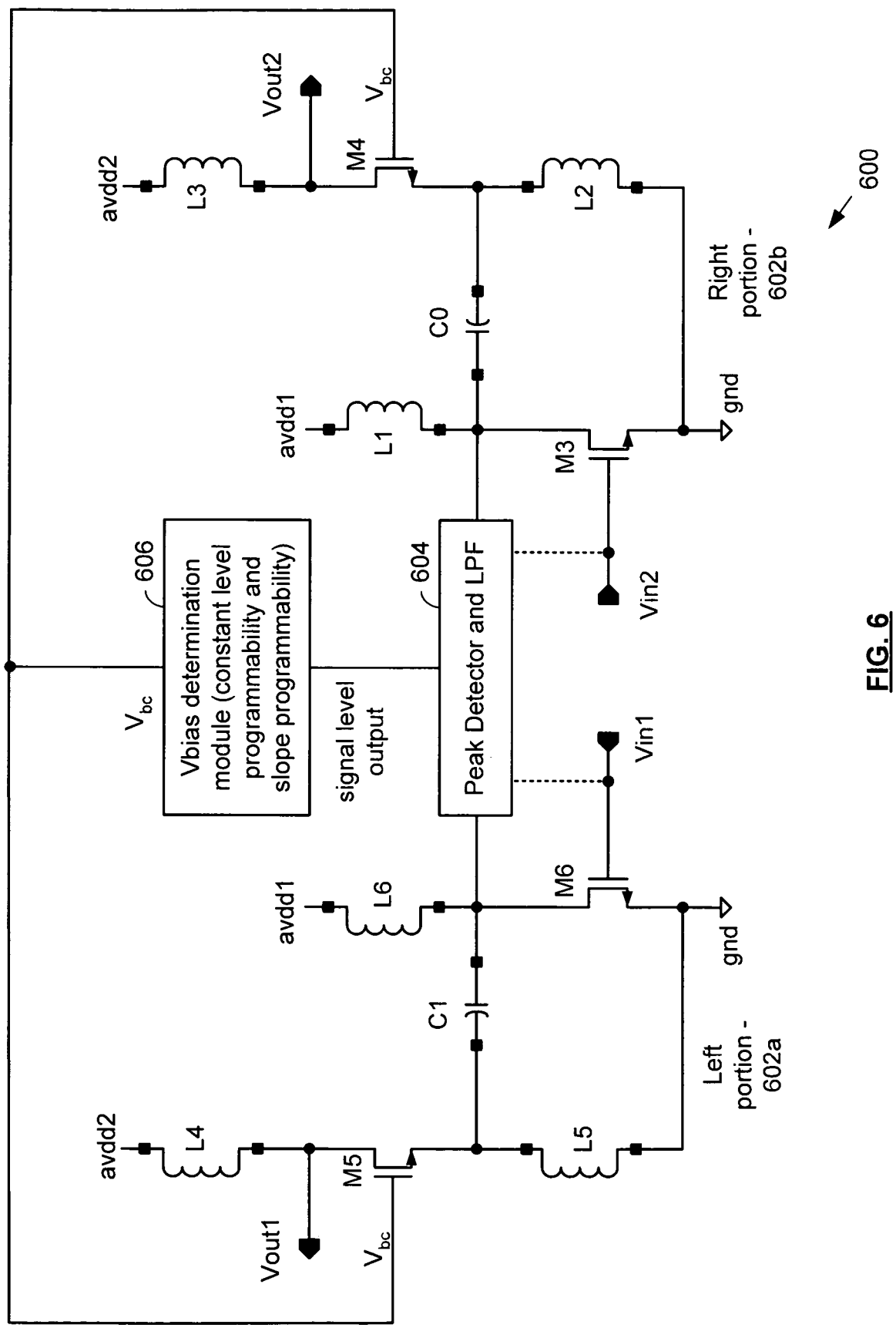
FIG. 6 is a schematic diagram illustrating a differential cascode power amplifier having variable cascode stage biasing according to the present invention.

FIG. 6 is a schematic diagram illustrating a differential cascode power amplifier 600 having variable cascode stage biasing constructed according to the present invention. The differential cascode power amplifier 600 includes a left portion 602a and a right portion 602b, a peak detector and low pass filter circuit 604, and a Vbias determination module 606. The left portion 602a and right portion 602b are similar to or the same as corresponding components that are illustrated and discussed with reference to FIG. 5 but that have been modified according to the additional structure of FIG. 6.

The peak detector and low pass filter circuit 604 measures the signal level of an output voltage signal Vout1 and Vout2 produced by a differential transconductance stage of the differential power amplifier. Alternately, the peak detector and low pass filter circuit 604 measures the signal level of the input voltage signal Vin1 and Vin2. Based upon the level of the monitored signal, the peak detector and low pass filter circuit 604 produces a signal level output. The signal level output is representative of a modulated signal that is being operated upon by the power amplifier. The Vbias determination module 606 receives the signal level output and, based upon the signal level output, produces a $V_{bc}$ voltage that is employed to bias each side of the differential cascode stage of the differential cascode power amplifier 600. Together, the peak detector and low pass filter 604 and the $V_{bc}$ determination module 606 may be referred to as a modulation detection and bias determination module. The modulation detection and bias determination module may also be employed to produce a $V_{bc}$ voltage for a single ended cascode power amplifier, such as is shown in FIG. 4 where $V_{bc}$ is not fixed, which will be described further with reference to FIGS. 11 and 12.

Linear and amplitude dependent modulation schemes require very linear amplification of the incoming signal while also servicing a very large peak to average ratio. Meeting these requirements has previously required that the power amplifier be biased in the power hungry class A or AB region that only occasionally consumes a large bias current when the peaks of the modulation occur. The occurrence of these peaks is infrequent and is dependent on the statistics of the particular modulation used. However ignoring these peaks would result in a poor amplification quality and a resultant poor error-vector magnitude.

The scheme of FIG. 6 utilizes the peak detector and low pass filter circuit 604 to estimate the input signal level, which is representative of the modulation. The signal level is then filtered and applied to the Vbias determination module 606 as the signal level output for adjusting the fixed level of $V_{bc}$ as well as the signal dependent part of $V_{bc}$. The resultant $V_{bc}$ signal is then applied to the gates of the cascode transistors M4 and M5. This scheme can produce a dramatic reduction in power consumption of the amplifier when used with high-linearity high peak-to-average ratio modulation schemes. Such structure and operation can increase the P1 dB of the operation of the power amplifier 600 in some cases.

In other embodiments, an envelope detector or another circuit that corresponds to an employed modulation scheme may replace the peak detector and low pass filter 604. When the serviced device supports differing modulation schemes, the operation of the peak detector and low pass filter 604 and the Vbias determination module 606 may be tailored to the modulation scheme employed in order to properly bias the cascode stage.

Cascode transistors M4 and M5 may have relatively thicker gate oxides and relatively longer channels than fine-geometry, low-voltage, high-Gm transistors M3 and M6. The thick oxide/long channel cascode transistors M4 and M5 are less prone to gate oxide damage and avalanche breakdown in their high voltage swing operation within the amplifier. The fine-geometry, low-voltage, high-Gm transistors M3 and M6 provide the accuracy required for the transconductance stage of the amplifier. Other advantages for this construct were previously described with reference to FIG. 3.

Figure 7:
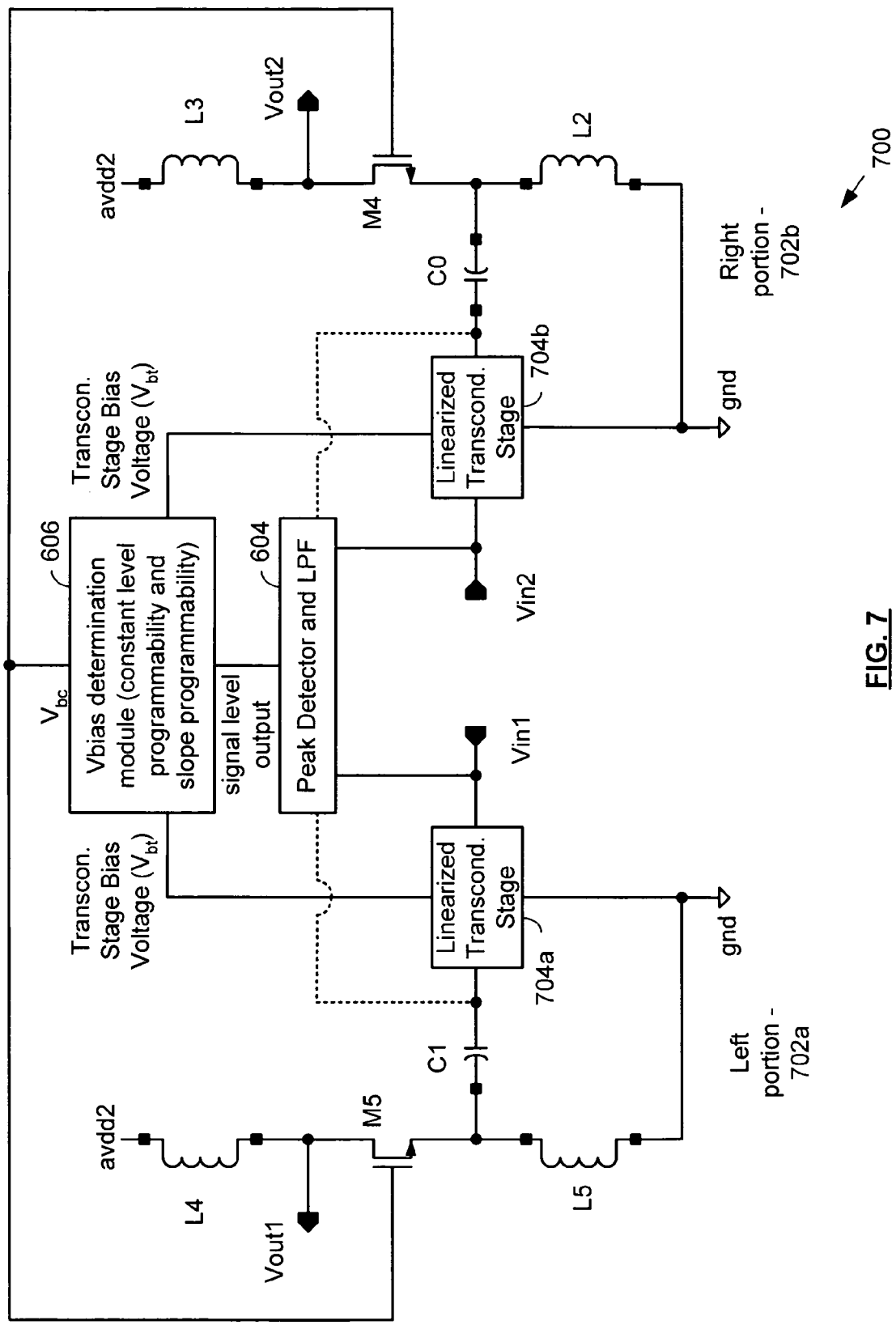
FIG. 7 is a schematic diagram illustrating a differential cascode power amplifier with a structure similar to that of FIG. 6 but that employs a linearized transconductance stage.

FIG. 7 is a schematic diagram illustrating a differential cascode power amplifier with a structure similar to that of FIG. 6 but that employs a linearized transconductance stage. As compared to the structure of FIG. 6, linearized transconductance stages 704a and 704b replace the transistor M3/M6 and inductor L1/L6 combinations. The peak detector and LPF 604 monitors either the Vin1/Vin2 signal pair and/or the outputs of the linearized transconductance stages 704a/704b. Particular examples of these linearized transconductance stages 704a/705b will be described further with reference to FIGS. 8-10B.

Figure 8:
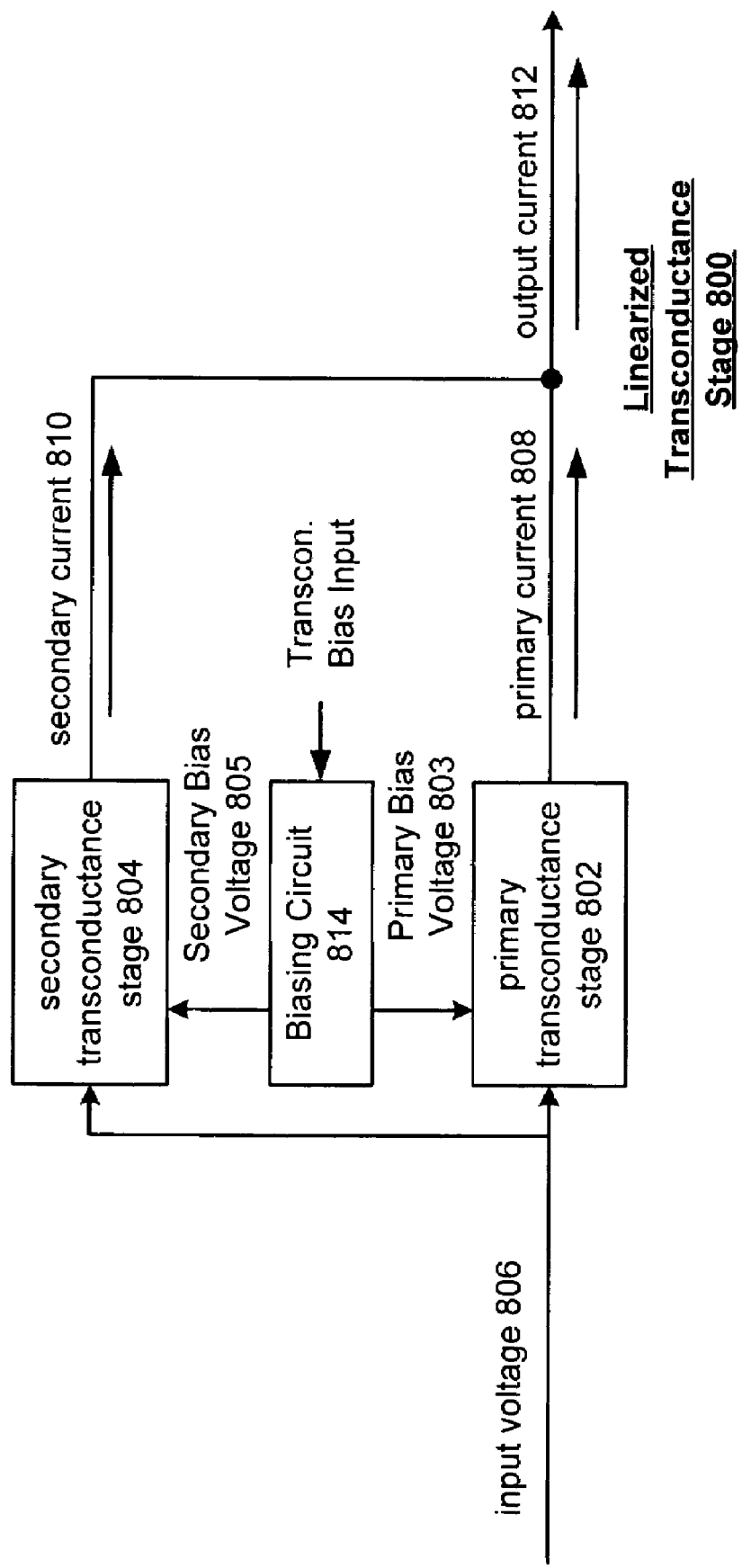
FIG. 8 is a block diagram illustrating a linearized transconductance stage that may be employed with a power amplifier constructed according to an embodiment of the present invention.

FIG. 8 is a block diagram illustrating a linearized transconductance stage that may be employed with a power amplifier constructed according to an embodiment of the present invention. As shown in FIG. 8, a linearized transconductance stage 800 includes a primary transconductance stage 802, secondary transconductance stage 804, and a biasing circuit 814. The biasing circuit 814 generates a primary bias voltage 803 and a secondary bias voltage 805. The primary bias voltage 803 may be greater than the secondary bias voltage 805 such that the primary transconductance stage 802 becomes active before the secondary transconductance stage 804 becomes active. The particular operations of the linearized transconductance stage 800 are described in further detail in U.S. Pat. No. 6,496,067, issued Dec. 17, 2002, which has common inventorship and a common assignee.

In operation, the primary transconductance stage 802 and the secondary transconductance stage 804 operably couple to receive the input voltage 806. Based on the primary bias voltage 803, the primary transconductance stage 802 converts the input voltage 806 into a primary current 808. The secondary transconductance stage 804 converts the input voltage 806 into a secondary current 810 based on the secondary bias voltage 805. The sum of the primary current 808 and the secondary current 810 produce an output current 812.

The biasing circuit 814, which may receive an input from the modulation detection and bias determination module, can dynamically add (or subtract) the output of the secondary transconductance stage 804 from the output of the primary transconductance stage 802 to obtain a wider and more linear transconductance range. As such, the transconductance gain of each stage 802 and 804 are added based on the bias voltages produced by the biasing circuit 814. As the input voltage 806 increases in magnitude, the secondary transconductance stage 804 is turned on and broadens the effective transconductance linear range of the linearized transconductance stage 800. As one of average skill in the art will appreciate, the current produced by the secondary transconductance stage 804 may effectively be subtracted from the current produced by the primary transconductance stage 802 to compensate for ripple variations in the overall transconductance transfer function of the transconductance stage 800. A linearization offset voltage of the transconductance stage can be selected large enough to cause a gain expansion (pre-distortion) in the generated output current as a result of the applied input voltage. This gain expansion can then be used to partially compensate for the gain compression that would be inherent in the output (cascode) stage because of headroom limitations. This can increase the 1-dB compression point of the overall amplifier and its linear operating range. The concepts illustrated in FIG. 8 apply equally well to a differential implementation.

Figure 9:
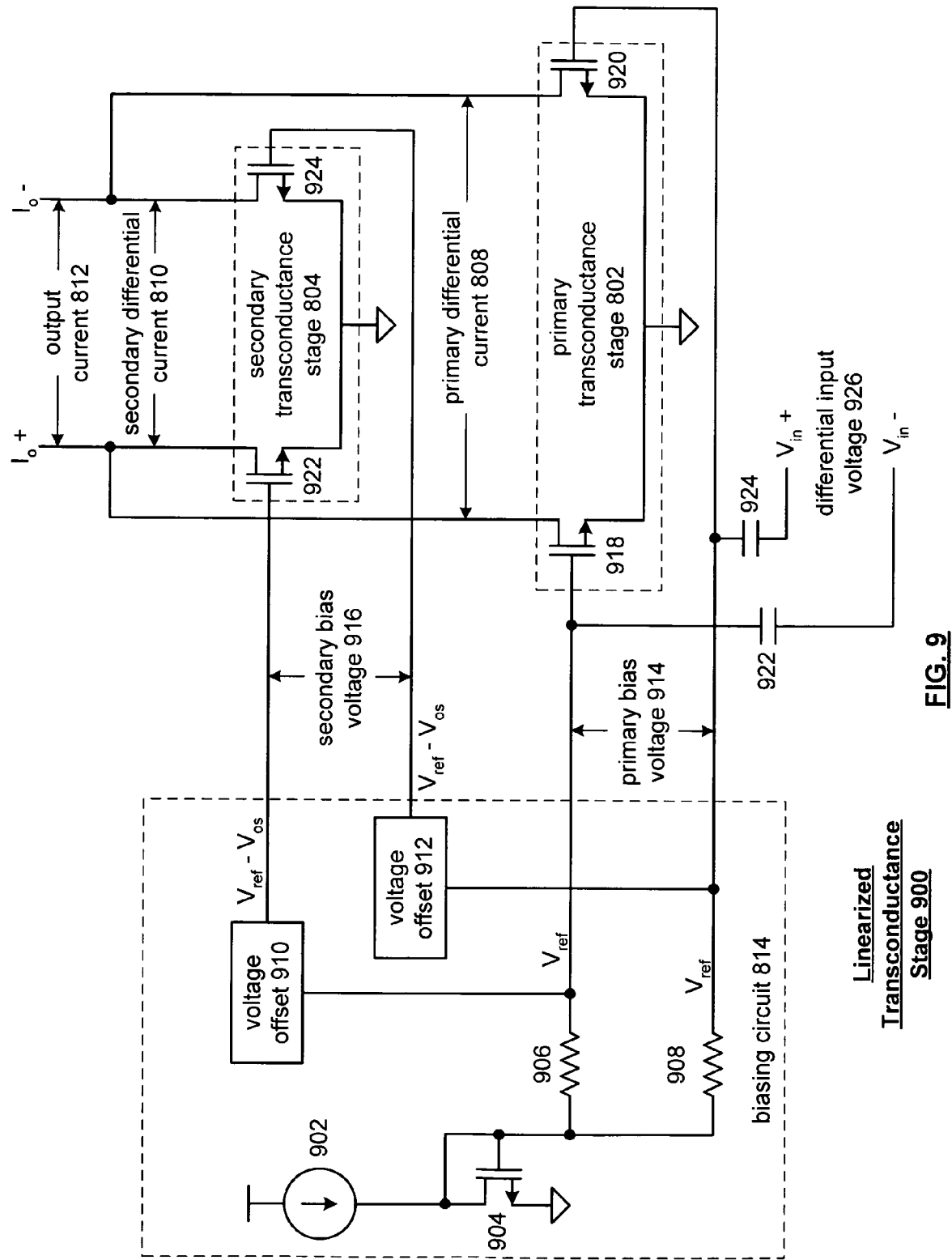
FIG. 9 is a schematic block diagram illustrating a first particular embodiment of the linearized transconductance stage of FIG. 8.

FIG. 9 is a schematic block diagram illustrating a first particular embodiment of the linearized transconductance stage 800 of FIG. 8. The linearized transconductance stage 900 includes a primary transconductance stage 802, a secondary transconductance stage 804, and a biasing circuit 814. The biasing circuit 814 may be part of, or operate complementary to the signal level detection and bias determination module illustrated previously with reference to FIGS. 6 and 7. The biasing circuit 814 includes current source 902 and transistor 904 and produces a reference voltage source ($V_{ref}$). The biasing circuit 814 also includes a resistive pair (resistors 906 and 908) and voltage offset modules 910 and 912. In this configuration, the biasing circuit 814 provides the reference voltage ($V_{ref}$) as the primary bias voltage 914 to the primary transconductance stage 802.

The voltage offset modules 910 and 912 subtract an offset voltage ($V_{os}$) from the reference voltage ($V_{ref}$). The resulting voltage ($V_{ref}$-$V_{os}$) is provided as the secondary bias voltage 916 to the secondary transconductance stage 804. Such an offset may be created by a diode, a battery, a biased transistor, etc.

The primary transconductance stage 802 includes a 1$^{st}$ transistor 918 and a 2$^{nd}$ transistor 920. The 1$^{st}$ transistor 918 is operably coupled via capacitor 922 to receive one leg (e.g., $V_{in}-$) of a differential input voltage 926 (differential version of input voltage 806 of FIG. 8). The $2^{nd}$ transistor 920 is operably coupled via capacitor 924 to receive a $2^{nd}$ leg (e.g., $V_{in}+$) of the differential input voltage 926. As configured, the primary transconductance stage 802 produces a primary differential current 808 from the differential input voltage 926 based on the primary bias voltage 914. Accordingly, the primary bias voltage 914 is set to a level that insures that for almost any differential input voltage 926 a primary differential current 808 is produced.

The secondary transconductance stage 804 includes a $1^{st}$ transistor 922 and a $2^{nd}$ transistor 924. The gate voltage of transistors 922 and 924 is based on the secondary bias voltage 916 and the differential input voltage 926. For instance, the gate voltage for one transistor is $V_{ref}-V_{os}+$delta $V_{in}$, while the gate voltage for the other transistor is $V_{ref}-V_{os}-$delta $V_{in}$. When the gate threshold voltage of one of the transistors 922 and 924 is exceeded, the secondary transconductance stage 804 generates the secondary differential current 810.

The output current 812 is the sum of the secondary differential current 810 and the primary differential current 808. Note that when the gate voltage on transistors 922 and 924 have not exceeded their threshold voltage, no secondary differential current 810 is produced. Thus, for relatively low differential input voltages 926, the output current 812 is produced solely by the primary differential current 808. As the magnitude of the differential input voltage 926 increases, the secondary transconductance stage 804 becomes active and generates the secondary differential current 810 which is added to the primary differential current 808 to produce the resulting output current 812, which improves the overall transconductance and linearity of the linearized transconductance stage 900.

Figure 10A:
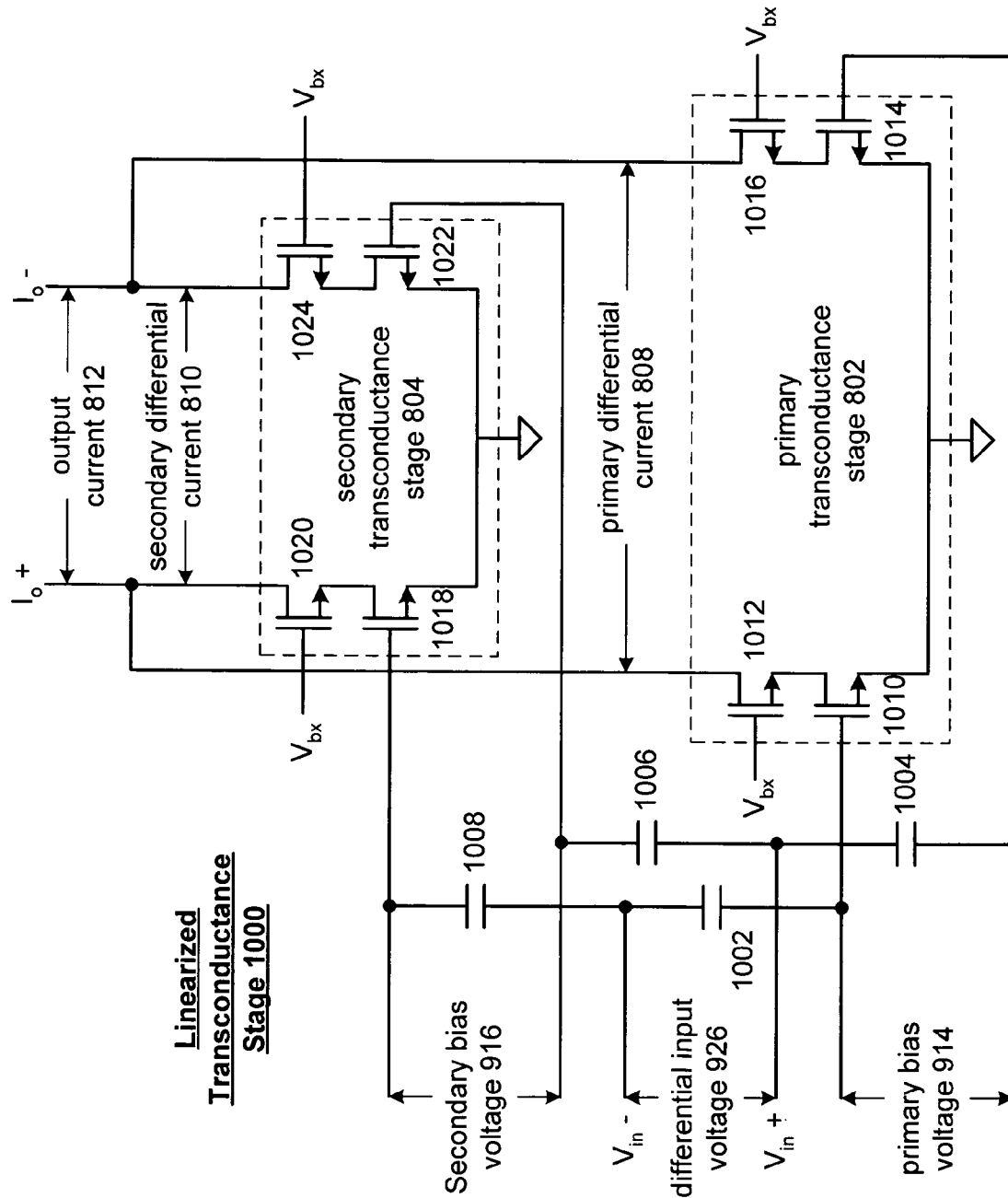
FIG. 10A is a schematic block diagram illustrating a second particular embodiment of the linearized transconductance stage of FIG. 8.

FIG. 10A is a schematic block diagram illustrating a second particular embodiment of the linearized transconductance stage 800 of FIG. 8. The linearized transconductance stage 1000 of FIG. 10A includes an alternate embodiment of the primary transconductance stage 802, an alternate embodiment of the secondary transconductance stage 804, and the biasing circuit 814 (not shown). The biasing circuit 814, as previously discussed with reference to FIG. 9, produces a secondary bias voltage 916 and a primary bias voltage 914. The differential input voltage 926 is operably coupled to the primary transconductance stage 802 via capacitors 1002 and 1004 and to the secondary transconductance stage 804 via capacitors 1006 and 1008.

The primary transconductance stage 802 includes a $1^{st}$ cascoded transistor pair 1010 and 1012 and a $2^{nd}$ cascoded transistor pair 1014 and 1016. Transistors 1012 and 1016 are operably coupled to receive a bias voltage ($V_{bx}$). The inclusion of the cascoded transistors 1012 and 1016 improves performance in at least some applications. The cascoded transistors 1012 and 1016 provide isolation from the secondary transconductance stage 804. The bias voltage $V_{bx}$ may be applied by the signal level detection and bias determination module that was previously described with reference to FIGS. 6 and 7 or may be applied by another circuit, e.g., a circuit illustrated in FIG. 10B.

The secondary transconductance stage 804 includes a $1^{st}$ cascoded transistor pair 1018 and 1020 and a $2^{nd}$ cascoded transistor pair 1022 and 1024. The cascoded transistors 1020 and 1024 are operably coupled to the transistor bias voltage ($V_{bx}$). The cascoded transistors 1020 and 1024 provide isolation from the primary transconductance stage 802.

As configured, the primary transconductance stage 802 produces the primary differential current 808 and the secondary transconductance stage 804 produces the secondary differential current 810. The output current 812 is the sum of the primary differential current 808 and the secondary differential current 810. As previously discussed, the secondary transconductance stage 804 does not immediately produce the secondary differential current 810. The secondary differential current 810 is produced when the differential input voltage 926 in combination with the secondary bias voltage 916 exceeds the threshold voltage of transistors 1018 and 1022.

Cascode transistors 1012, 1016, 1020, and 1024 may have relatively thicker gate oxides and relatively longer channels than fine-geometry, low-voltage, high-Gm transistors 1010, 1014, 1018, and 1022. Advantages for this construct and relative dimensions of the transconductance transistors 1010, 1014, 1018, and 1022 versus the cascode transistors 1012, 1016, 1020, and 1024 were previously described with reference to FIG. 3.

Figure 10B:
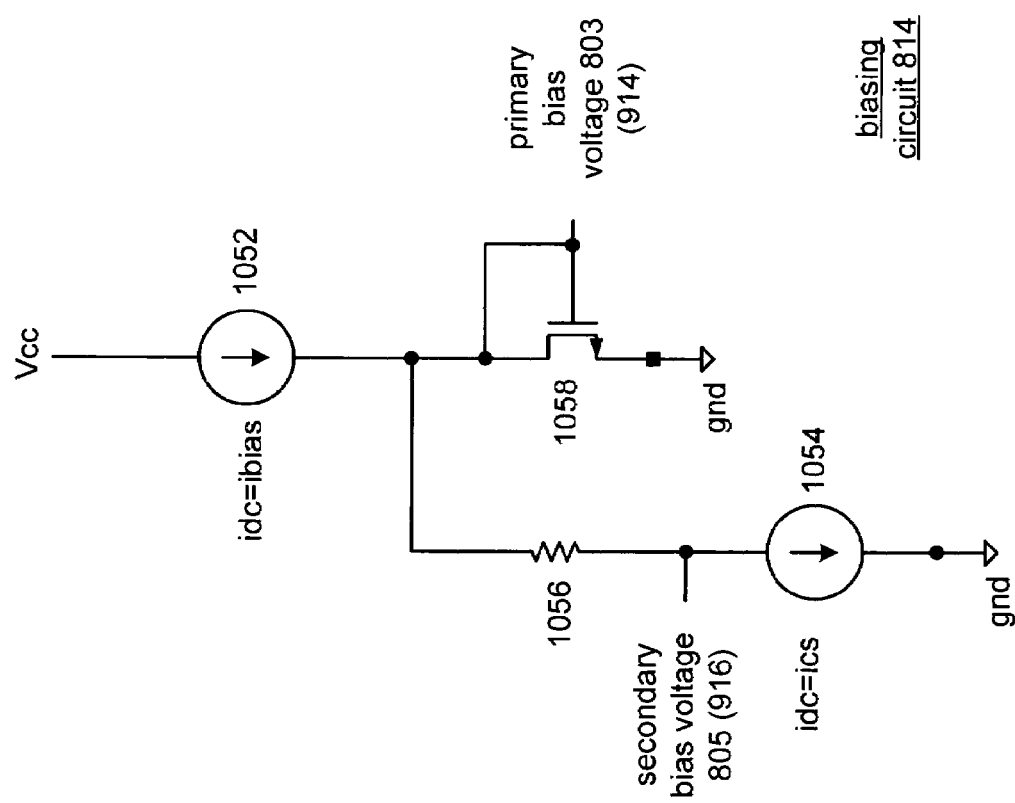
FIG. 10B is a schematic diagram illustrating another embodiment of the biasing circuit of FIG. 8.

FIG. 10B is a schematic diagram illustrating another embodiment of the biasing circuit 814 of FIG. 8. The biasing circuit 814 of FIG. 10B may be employed instead of the biasing circuit of FIG. 9 in biasing the linearized transconductance stage 1000 of FIG. 10A. The biasing circuit includes current sources 1052 and 1054, resistor 1056, and transistor 1058. The transistor 1058 has its drain and source terminals tied at produces the primary bias voltage 914. The secondary bias voltage 916 is produced at the junction of resistor 1056 and current source 1054.

Figure 11:
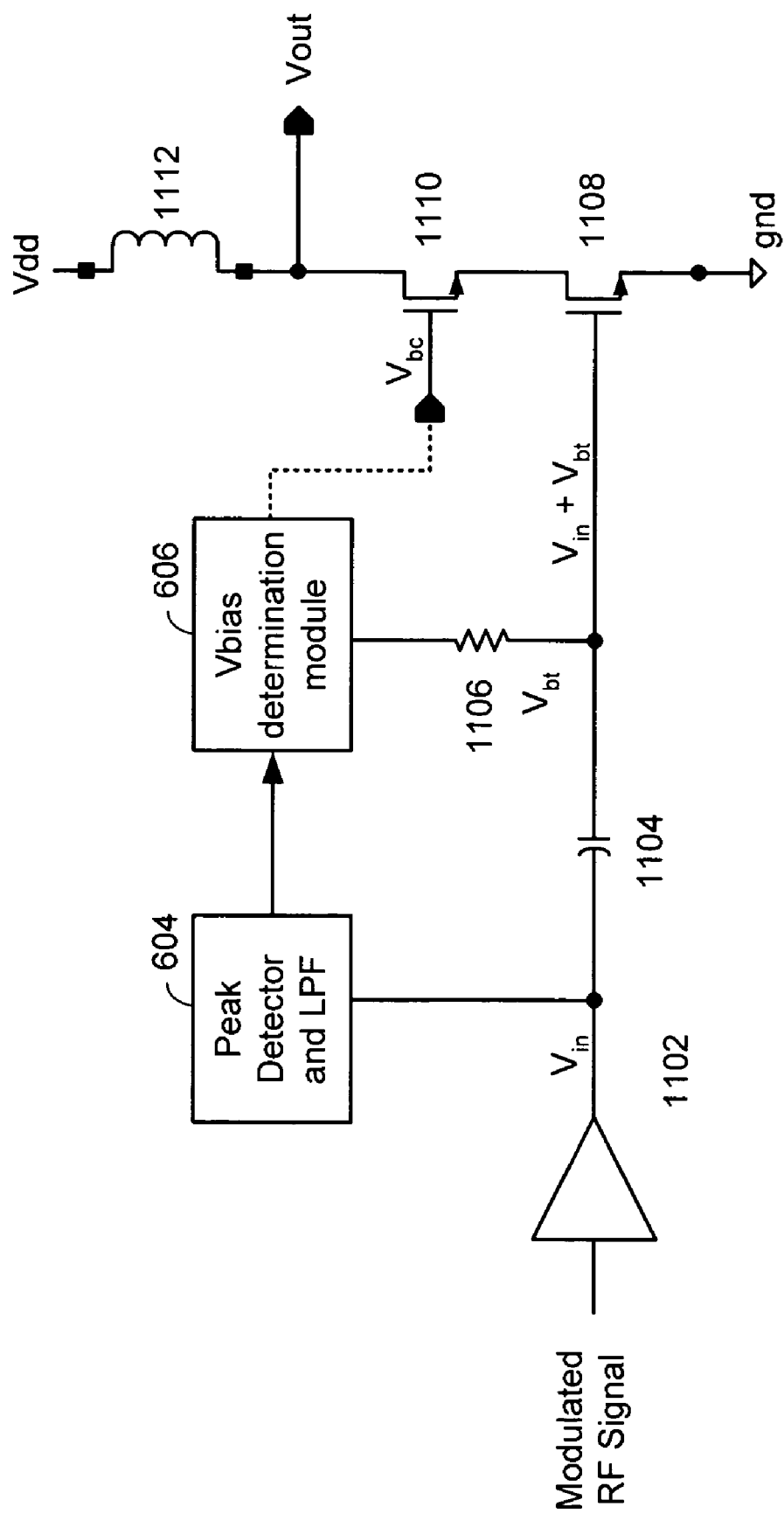
FIG. 11 is a schematic diagram illustrating a power amplifier having modulation dependent transconductance stage biasing.

FIG. 11 is a schematic diagram illustrating a power amplifier 1100 having modulation dependent transconductance stage biasing. The power amplifier 1100 includes a power amplifier driver 1102, capacitor 1104, transconductance device 1108, cascode transistor 1110, and inductor 1112. The power amplifier 1100 also includes a peak detector and LPF 604, vbias determination module 606, and resistor 1106 that produce the transconductance stage bias voltage ($V_{bt}$). In an illustrated embodiment of the power amplifier 1100, $V_{bc}$ is fixed (as it may be biased by the biasing circuit 814 of FIG. 10B). One variation of the power amplifier 1100 of FIG. 11 includes varying both $V_{bt}$ and $V_{bc}$ based upon the level of $V_{in}$ to alter the operational characteristics of the power amplifier 1100. Another variation includes replacing the resistor 1106 with an inductor or another circuit element.

The manner in which the transconductance stage bias voltage $V_{bt}$ is varied based upon the level of the input signal $V_{in}$ is similar to the manner in which the cascode stage bias voltage $V_{bt}$ is varied based on the level of the input signal as was described with reference to FIG. 7. One particular technique for varying $V_{bt}$ and/or $V_{bc}$ will be described further with reference to FIG. 12.

With one variations of the power amplifier 1100, an inductor replaces the resistor 1106. With another variation of the power amplifier 1100, cascode transistor 1110 is eliminated. In another variation of the power amplifier 1100, transistor 1108 is degenerated using a resistor and/or an inductor. Further, the transistor 1108 may be replaced by a linearized transconductance stage as described with reference to FIGS. 8-10B. A differential version of the power amplifier 1100 may be constructed in a straightforward manner, similar to the constructs previously described.

Figure 12:
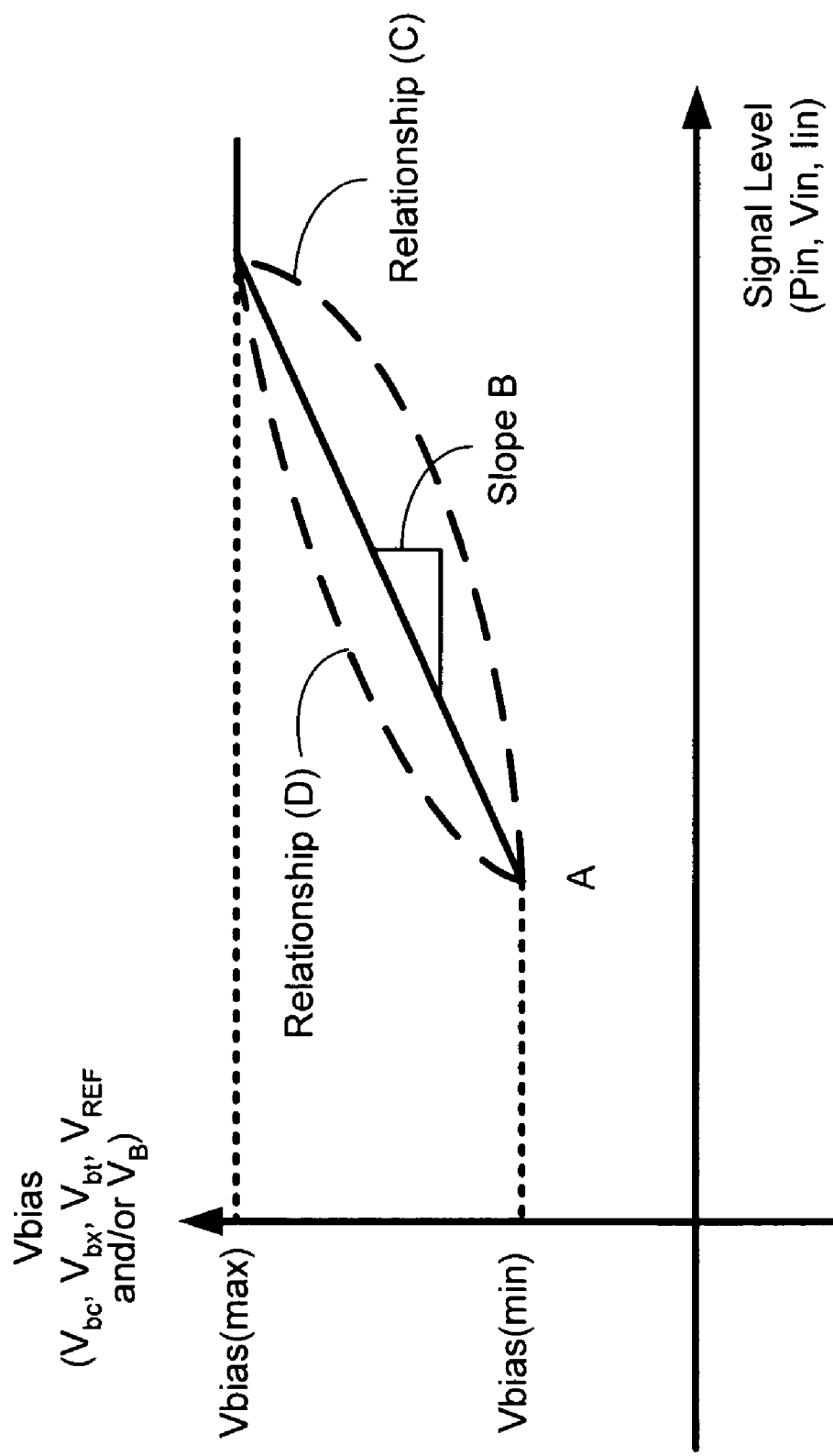
FIG. 12 is a graph illustrating one technique for adjusting a power amplifier bias voltage according to an embodiment of the present invention.

FIG. 12 is a graph illustrating one technique for adjusting a power amplifier bias voltage according to an embodiment of the present invention. As is shown, the bias voltage ($V_{bc}$, $V_{bx}$, $V_{bt}$, $V_{REF}$ and/or $V_B$) applied to a transconductance stage and/or to a cascode stage is dependent upon a detected/measured signal level, e.g., Power in (Pin), Voltage in (Vin), Current in (Iin), etc. that is representative of a serviced modulation characteristic. Generally, the bias voltage does not go below a minimum level Vbias(min) or extend above a maximum level Vbias(max). When operating between Vbias(min) and Vbias(max), the bias voltage may vary linearly or non-linearly with the measured signal level. The slope or characterization of this curve may be fixed or may be variable depending upon the particular implementation. The selection of the minimum level, the maximum level, and the slope there between may be selected based upon the modulation type(s) serviced by the power amplifier, e.g., BPSK, GMSK, QPSK, 8 PSK, 16 QAM, 32 QAM 64 QAM, 128 QAM, 256 QAM, 512 QAM, 1024 QAM, etc.

Illustrated particularly in FIG. 12 are three relationships between input signal level and power amplifier bias voltage. A first relationship is linear and has a Slope B. The second relationship (C) is non linear. The third relationship (D) is also non-linear. Note that each of these relationships, be they linear or non-linear, extend from Vbias(min) to Vbias(max) over a range of input signal level. The reader should note that the input signal level at which the power amplifier bias voltage extends from Vbias(min) and the input signal level at which the power amplifier bias voltage meets Vbias(max) is programmable/configurable at the Vbias determination module.

Figure 13:
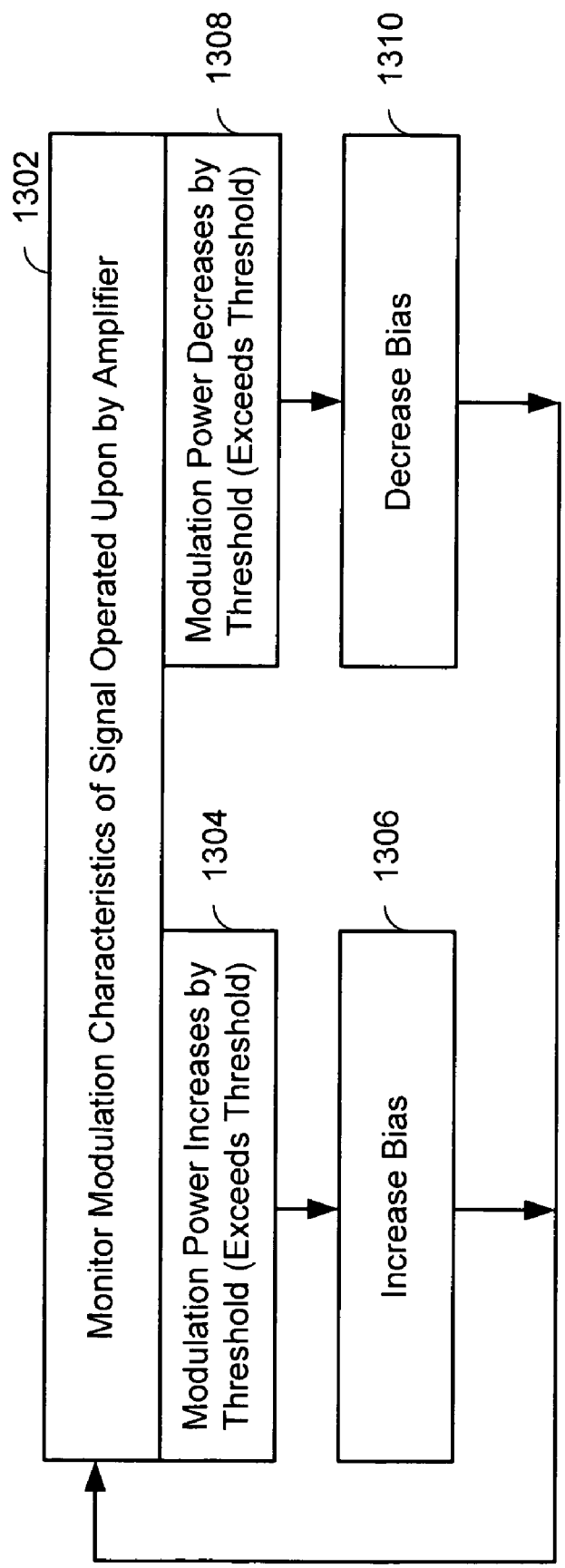
FIG. 13 is a flow chart illustrating operation according to one embodiment of the present invention in adjusting a bias level of a power amplifier.

FIG. 13 is a flow chart illustrating operation according to one embodiment of the present invention in adjusting a bias level of a power amplifier. At step 1302 the modulation characteristics of a signal operated upon by the power amplifier are monitored. When such monitoring indicates that the modulation power (power of modulation envelope) increases by a threshold/exceeds a threshold (step 1304), the bias of the power amplifier is increased (step 1306). When such monitoring indicates that the modulation power (power of modulation envelope) decreases by a threshold/moves below a threshold (step 1308), the bias of the power amplifier is decreased (step 1310). Such an increase/decrease in the bias of the power amplifier may be caused using one of the techniques previously described with reference to FIGS. 5-12 or by another technique. From steps 1306 and 1310, operation returns to step 1302.

Figure 14:
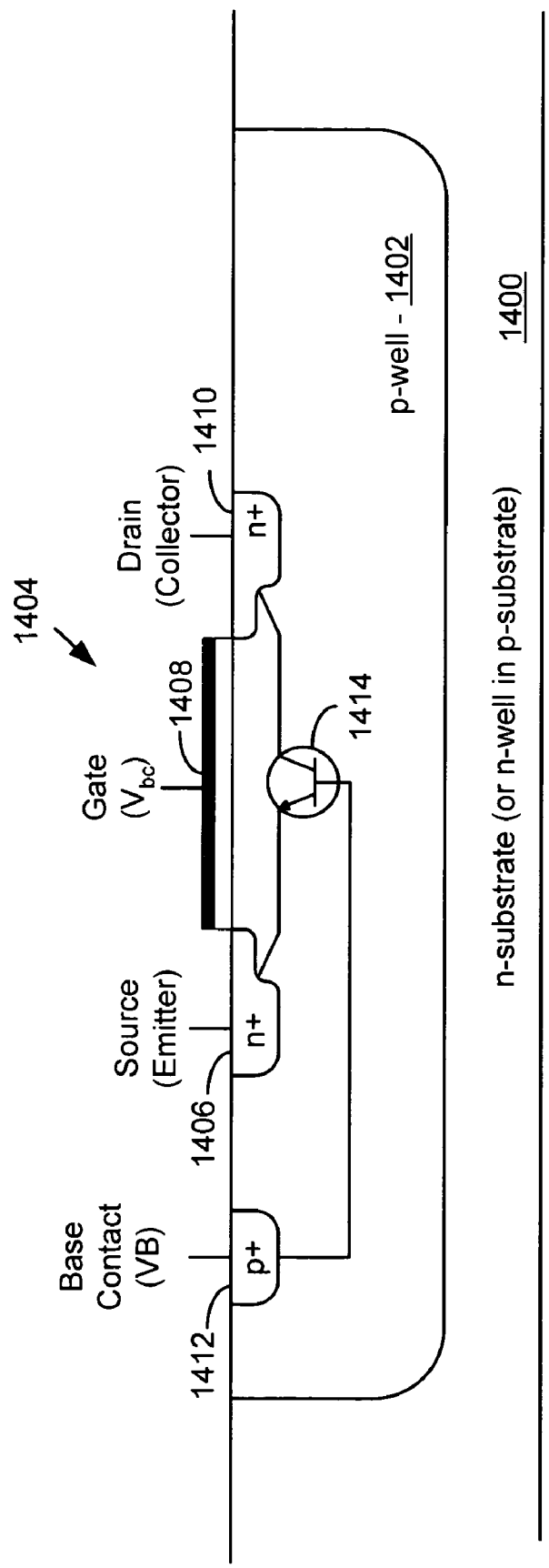
FIG. 14 is a cross-section taken along the channel of an N-type Metal-Oxide-Silicon (NMOS) transistor illustrating a parasitic NPN bipolar transistor formed therewith according to the present invention.

FIG. 14 is a cross-section taken along the channel of an N-type Metal-Oxide-Silicon (NMOS) transistor illustrating a parasitic NPN bipolar transistor 1414 formed therewith according to the present invention. The NMOS transistor 1404 is formed in a p-well 1402, which is formed either in an N-substrate 1400 or in an N-well in a P-type substrate (not shown). The NMOS transistor 1404 has a conventional structure with an N+ source 1406, an N+ drain 1410, a channel defined there between in the P-well 1402, and a gate 1408 having a gate conductor and an insulative gate oxide formed between the channel and the gate conductor. The parasitic NPN bipolar transistor 1414 is a byproduct of the structure of the NMOS transistor 1404. The parasitic NPN bipolar transistor 1414 has an emitter that corresponds to the source 1406 of the NMOS transistor 1404 and a collector that corresponds to the drain 1410 of the NMOS transistor 1404. A base of the NPN bipolar transistor 1414 corresponds to the p-well 1402 in which the NMOS transistor 1404 is formed. Thus, the collector and emitter terminals of the parasitic NPN bipolar transistor 1414 resides effectively in parallel with the drain and source terminals of the NMOS transistor 1404.

The body of the NMOS transistor 1414 is typically tied to ground (or sometimes in lower frequency applications it is tied to the source terminal). In a triple well (or other) process the body of the NMOS transistor, which is the base of the parasitic NPN bipolar transistor, is available as a separate terminal. When the body is tied to ground, the parasitic NPN bipolar transistor is kept off. Under high electric field conditions, hole-electron pair generation in the high-field region close to the drain can inadvertently turn on the parasitic NPN bipolar transistor causing an undesired avalanche effect and snap back behavior in the device.

According to the present invention, the base of the parasitic NPN bipolar transistor 1414 is brought out so that it may be separately controlled to enhance the operation of an amplifier that employs the NMOS transistor 1404. In particular, a base contact 1412 of the parasitic NPN bipolar transistor 1414 is brought out using a P+ junction so that a bias voltage (VB) may be controllably applied thereto. By bringing out the body terminal (the base of the parasitic NPN bipolar transistor 1414), the composite device may be used as a follower. Depending on the application, the gate voltage ($V_{bc}$) and the base voltage (VB) can be independently controlled, resulting in the parasitic NPN bipolar transistor 1414 being fully off to fully on and/or the NMOS device 1404 being fully off to fully on, as will be described further with reference to FIG. 17.

One amplifier structure that may employ the structure of FIG. 14 is the cascode amplifier. Two particular embodiments of cascode amplifiers using the structure of FIG. 14 are described in more detail with reference to FIGS. 15-16. In these implementations, the NMOS transistor 1404 and the parasitic NPN bipolar transistor 1414 together serve as the cascode device. With the cascode device, the highest current efficiency is achieved by controlling the parasitic NPN bipolar transistor 1414 while forcing off the NMOS transistor 1404 since the impedance provided by the cascode device would be 1/gm of the bipolar device (with the NMOS transistor 1404 off) where gm=Ic/VT and VT=kT/q. The operating characteristics of the cascode amplifier may be altered by altering VB and $V_{bc}$ differently, e.g., both NMOS transistor 1404 and parasitic NPN bipolar transistor 1414 on, or NMOS transistor 1404 on and parasitic NPN bipolar transistor 1414 off, etc.

Note that the device of FIG. 14 may be alternately implemented as a PMOS transistor and parasitic PNP transistor. In such case, the PMOS transistor is formed in an N-well. This differing structure may be used as a cascode device or as another device in a fashion similar to that described with reference to the device of FIG. 14.

Figure 15:
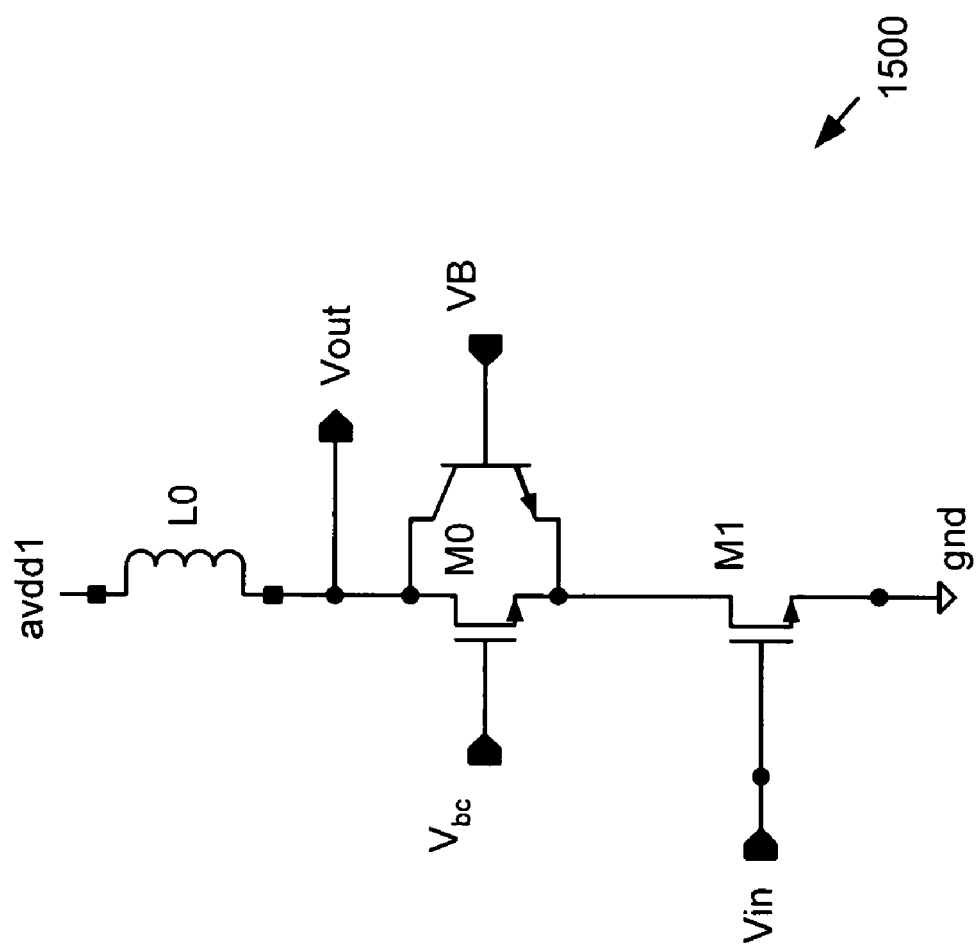
FIG. 15 is a schematic diagram illustrating a first embodiment of a singled ended cascode power amplifier having a controlled parasitic device according to the present invention.

FIG. 15 is a schematic diagram illustrating a first embodiment of a singled ended cascode power amplifier 1500 having a controlled parasitic device according to the present invention. The single-ended cascode power amplifier 1500 has a structure similar to that of the single-ended cascode amplifier of FIG. 3 except that the cascode device includes a controlled MOS transistor and a separately controlled parasitic bipolar junction transistor according to the present invention. According to this embodiment, $V_{bc}$ (the gate voltage of the NMOS transistor 1404) and VB (the base voltage of the parasitic NPN transistor 1414) are separately controllable. By separately controlling the gate voltage ($V_{bc}$) of the NMOS transistor 1404 and the base voltage (VB) of the parasitic NPN bipolar transistor 1414, the overall operation of the single ended cascode amplifier 1500 may be controlled so that it is more linear in a desired operating range and so that it operates as efficiently as possible to control current drain.

Figure 16:
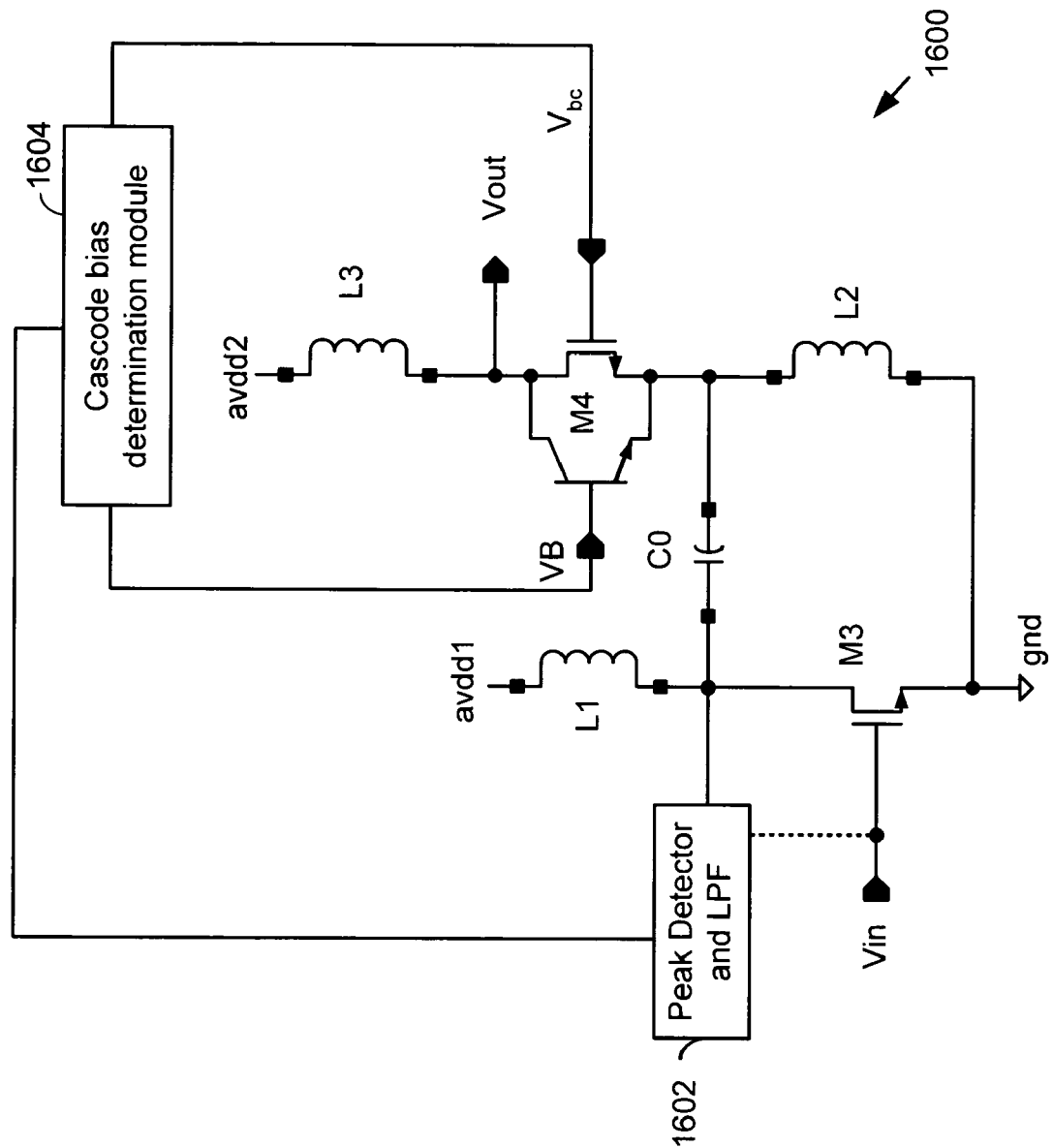
FIG. 16 is a schematic diagram illustrating a second embodiment of a single ended cascode power amplifier having a controlled parasitic device according to the present invention.

FIG. 16 is a schematic diagram illustrating a second embodiment of a single ended cascode power amplifier 1600 having a controlled parasitic device according to the present invention. The single-ended cascode power amplifier 1500 has a structure similar to that of the single-ended cascode amplifier of FIG. 4 except that it has a controlled parasitic device according to the present invention. A peak detector and LPF 1602 and cascode bias determination module 1604 separately control VB (the base of the parasitic NPN transistor 1414) and $V_{bc}$ (the gate voltage of the NMOS transistor 1404). By separately controlling the gate voltage ($V_{bc}$) of the NMOS transistor and the base voltage (VB) of the parasitic NPN bipolar transistor, the overall operation of the single ended cascode amplifier 1500 may be controlled so that it is more linear in a desire operating range and so that it is as efficient as possible.

The reader will appreciate that the structures of FIGS. 15 and 16 may serve as sides of differential cascode amplifiers, same or similar to the structures of FIGS. 5, 6, and 7. Further, the structure of FIG. 15 may be employed in an amplifier having an adjustable bias voltage such as the structure illustrated in FIG. 11. The peak detector and LPF 1602 and the bias determination module 1604 may be referred to as a signal level detection and bias determination module. Further, the structures of FIGS. 14-16 may be employed in a transconductance device or a transconductance stage of an amplifier in combination with the other teachings of FIGS. 3-13. With this combination, the separately controllable parallel transistor structure of FIG. 14 may replace any of the transistors illustrated in FIGS. 3-13.

Figure 17:
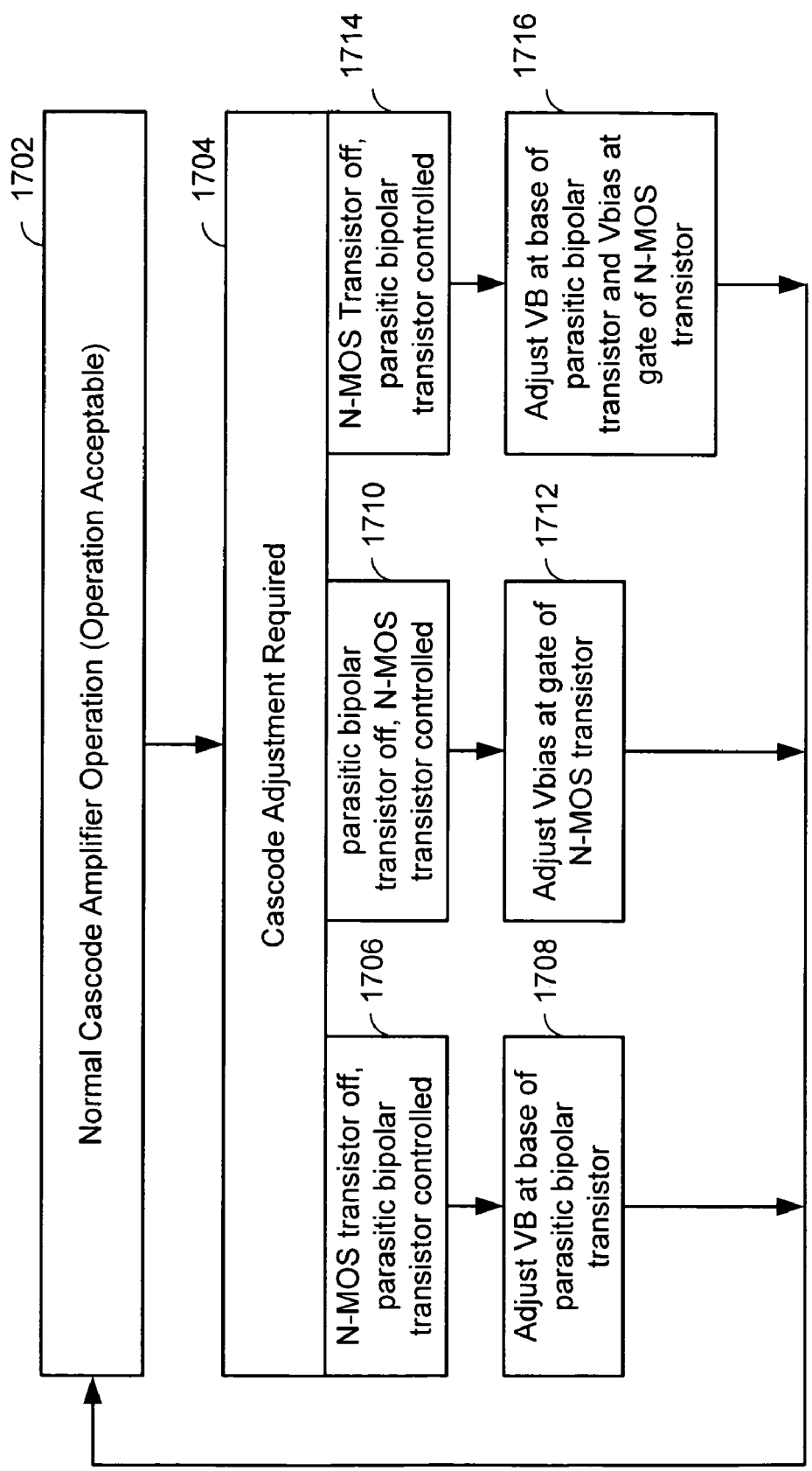
FIG. 17 is a flow chart illustrating operation of the cascode amplifiers of FIGS. 15 and 16 according to one embodiment of the present invention in adjusting bias levels of the respective cascode stages.

FIG. 17 is a flow chart illustrating operation of the cascode amplifiers of FIGS. 15 and 16 according to one embodiment of the present invention in adjusting bias levels of the respective cascode stages. At step 1702, the cascode amplifier is operating in a normal fashion and no adjustment is required. However, based upon the characteristics of a signal monitored by the peak detector and LPF 1502 (1602) and cascode bias determination module 1504 (1604) combination, a determination is made that cascode adjustment is required (step 1704). In such case, one of three differing sets of operations is considered/performed. When the NMOS (PMOS) transistor is turned off and the parasitic bipolar transistor is turned on (step 1706), VB at the base of the parasitic bipolar transistor is adjusted, i.e., increased/decreased to adjust operation of the cascode stage of the cascode amplifier (step 1708). When the NMOS (PMOS) transistor is turned on and the parasitic bipolar transistor is turned off (step 1710), $V_{bc}$ at the gate of the NMOS transistor is adjusted, i.e., increased/decreased to adjust operation of the cascode stage of the cascode amplifier (step 1712). When both the NMOS (PMOS) transistor and the parasitic bipolar transistor are turned on is turned on (step 1714), both VB at the base of the parasitic bipolar transistor and $V_{bc}$ at the gate of the NMOS transistor are adjusted, i.e., both altered or one unaltered and the other altered to adjust operation of the cascode stage of the cascode amplifier (step 1716). From steps 1708, 1712 and 1716 operation returns to step 1702.

Figure 18:
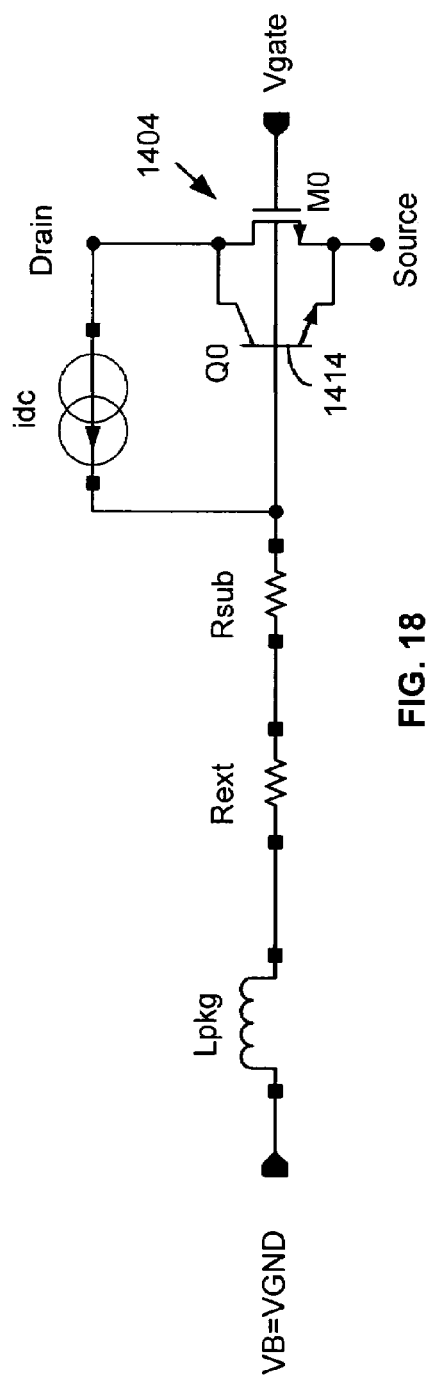
FIG. 18 is a schematic diagram illustrating a technique for tying a base of a parasitic NPN bipolar transistor to ground via an external resistance.

FIG. 18 is a schematic diagram illustrating a technique for tying a base of a parasitic NPN bipolar transistor to ground via an external resistance. With this technique, the body (p-well 1402) of the NMOS transistor 1404 is tied to ground via an external path that is represented by the inherent substrate and contact resistance for the body (Rsub), an external routing resistance employed to connect the body to ground (Rext), and an inductance of the external connection (Lpkg). The body (p-well 1402) is tied to ground via this connection in an attempt to keep the parasitic NPN bipolar transistor 1414 turned off to avoid avalanche breakdown. Avalanche breakdown occurs when, under high electric field conditions, hole-electron pair generation in the high-field region close to the drain 1410 injects holes into to the body of the device. The current created by such hole injection passes through Rsub and Rext and turns the parasitic NPN bipolar transistor 1414 on by forward biasing its Base-Emitter junction. This phenomena may lead to a positive feedback loop in which the collector of the parasitic bipolar transistor 1414 itself injects holes into the base Rsub and Rext resulting in the start of the avalanche breakdown phenomena. If the high electric field on the drain 1410 of the transistor is due to a high frequency ac signal (as opposed to just DC voltage) the inductor Lpkg can also play a role in turning the parasitic bipolar transistor 1414 on, particularly if the source terminal 1406 is not grounded.

Figure 19:
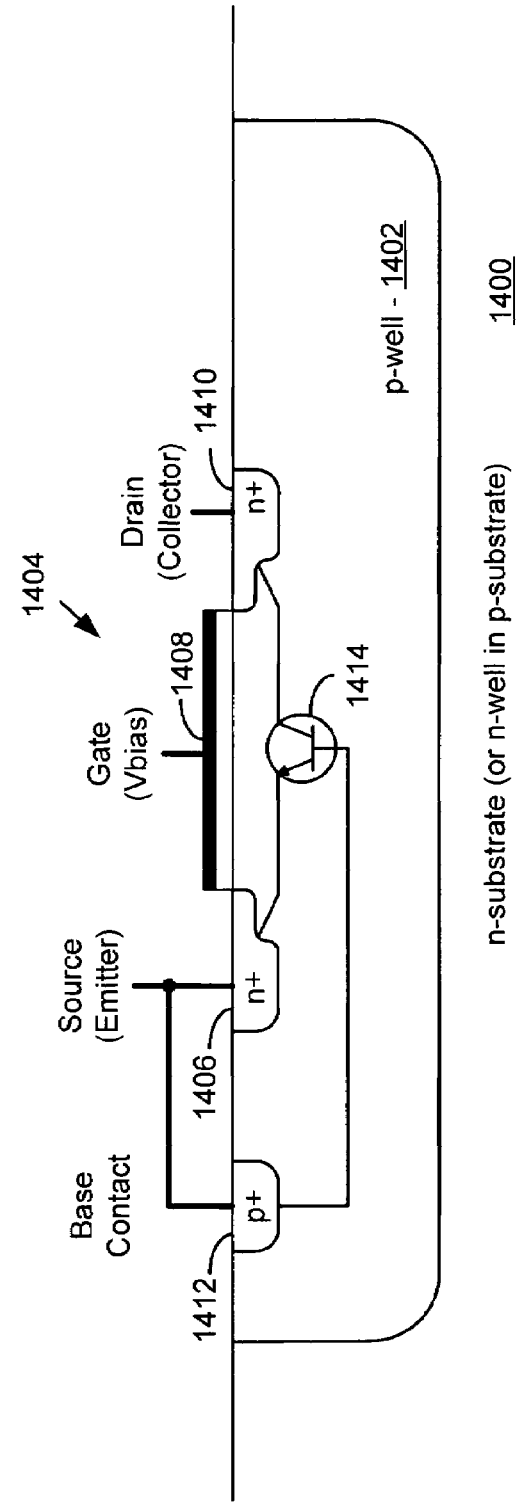
FIG. 19 is a cross-section taken along the channel of an N-type Metal-Oxide-Silicon (NMOS) transistor illustrating a parasitic NPN bipolar transistor having its base directly coupled to a source of the NMOS transistor according to the present invention.

FIG. 19 is a cross-section taken along the channel of an N-type Metal-Oxide-Silicon (NMOS) transistor illustrating a parasitic NPN bipolar transistor 1414 having a base contact 1412 directly coupled to a source 1406 of the NMOS transistor according to the present invention. With the structure of FIG. 19, the body terminal (p-well 1402) of the NMOS transistor 1404 is brought out via the base contact 1412 that is directly tied to the source 1406 of the NMOS transistor 1404. At low frequencies, such tying is done in an effort to reduce the gmb of the composite device (transconductance associated with the source body junction) and to reduce the body effect and the resultant increase in the threshold voltage of the NMOS transistor 1404. As will be described further with reference to FIGS. 20 and 21, this structure is employed with a power amplifier in order to ensure that the parasitic bipolar NPN transistor 1414 is not inadvertently turned on. The connection between the base contact 1412 and the source 1406 is a direct connection using a low metal layer, e.g., metal-1, metal-2, or a plug that resides upon a surface of the p-well 1402, base contact 1412, and source 1406. With this structure, Rext and Lpkg are eliminated and cannot contribute to the difference in potential between the base (p-well 1402) and emitter 1406 of the parasitic NPN bipolar transistor 1414. Rsub is made small by using proper multi-island laid out devices and many substrate contacts.

Figure 20:
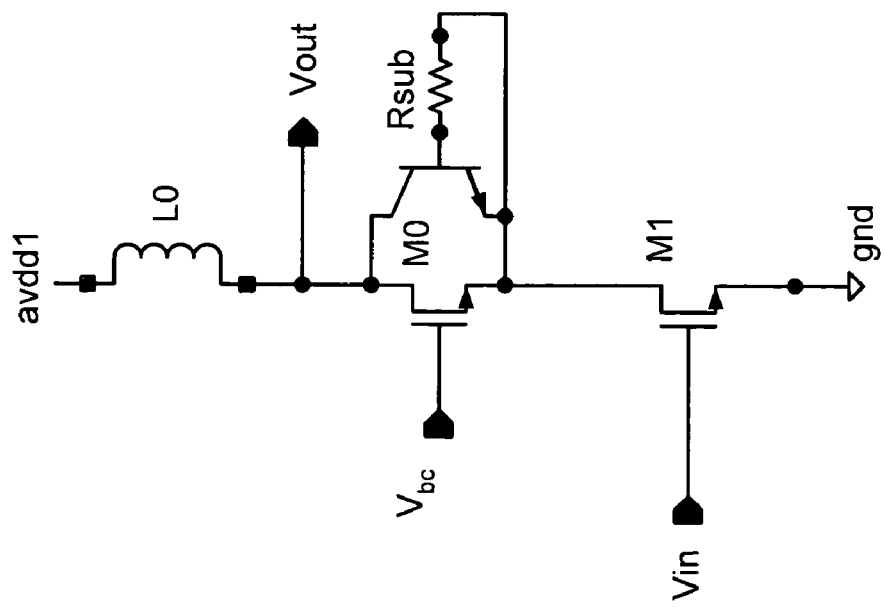
FIG. 20 is a schematic diagram illustrating a first embodiment of a singled ended cascode power amplifier having a parasitic NPN bipolar transistor terminated according to the present invention.

FIG. 20 is a schematic diagram illustrating a first embodiment of a singled ended cascode power amplifier 2000 having a MOS transistor and a parasitic NPN bipolar transistor formed therewith and terminated according to the present invention. The single-ended cascode power amplifier 2000 has a structure similar to that of the single-ended cascode amplifier of FIG. 3 except that the cascode device has both a MOS transistor and a parasitic bipolar junction transistor formed in parallel therewith with a base of the parasitic bipolar transistor tied to a source of the MOS transistor. This structure may also include a peak detector and LPF 1108 and bias determination module 1110 that controls $V_{bc}$.

Figure 21:
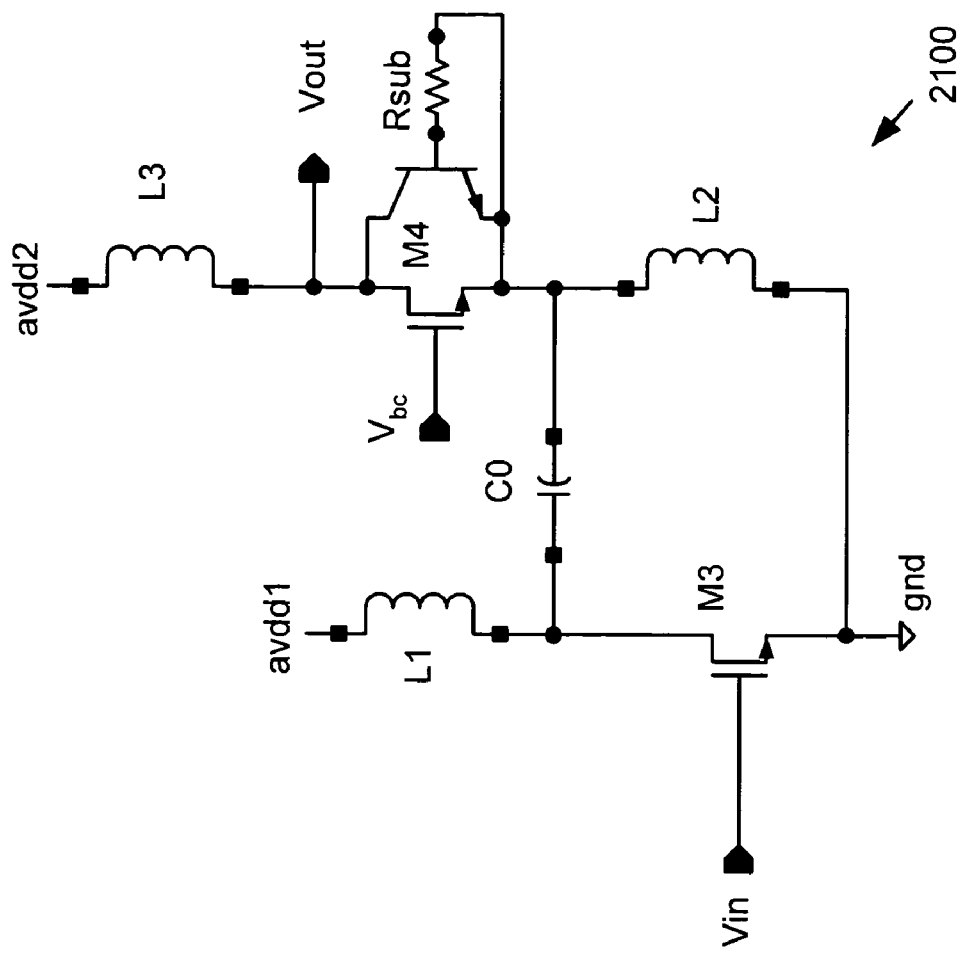
FIG. 21 is a schematic diagram illustrating a second embodiment of a singled ended cascode power amplifier having a parasitic NPN bipolar transistor terminated according to the present invention.

FIG. 21 is a schematic diagram illustrating a second embodiment of a singled ended cascode power amplifier 2100 having a parasitic NPN bipolar transistor terminated according to the present invention. The single-ended cascode power amplifier 2100 has a structure similar to that of the single-ended cascode amplifier of FIG. 4 except that the cascode device has both a MOS transistor and a parasitic bipolar junction transistor formed in parallel therewith and having with a base of the parasitic bipolar transistor tied to a source of the MOS transistor. The reader will appreciate that the structures of FIGS. 20 and 21 may serve as sides of differential cascode amplifiers, same or similar to the structures of FIGS. 5, 6, and 7. The structure of FIG. 21 may be employed in cascode amplifiers having an adjustable bias voltage applied to the gate of transconductance stage transistor(s) and/or an adjustable bias voltage applied to the gate of cascode stage transistor(s), various embodiments of which were previously described with reference to FIGS. 6-13.

Figure 22:
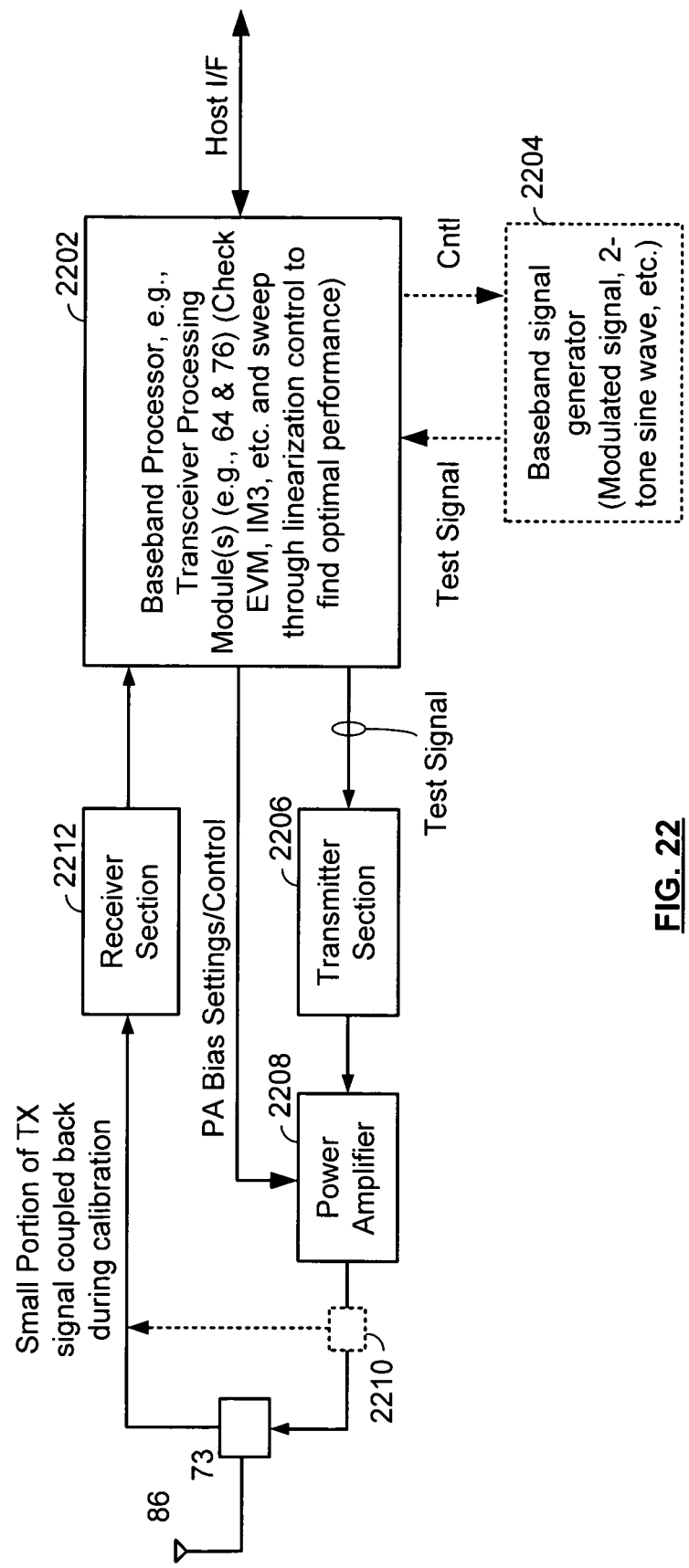
FIG. 22 is a block diagram illustrating a system for controlling the linearization of a power amplifier according to an embodiment of the present invention.

FIG. 22 is a block diagram illustrating a system for controlling the linearization of a power amplifier according to an embodiment of the present invention. The system includes various components previously described with reference to FIG. 2 and other of the FIGS. A baseband processor 2202 includes digital receiver processing modules 64 and 76 of FIG. 2 and may include additional components such as memory 75 and other components. A receiver section 2212 communicatively couples to the baseband processor and includes previously described components, among others. A transmitter section 2206 communicatively couples to the baseband processor 2202 and includes a power amplifier

2208. Transmitter section 2206 components were also described with reference to FIG. 2 and will not be described further with reference to the present FIG. 22.

In a calibration operation, the baseband processor 2202 produces a test signal to the transmitter section. The test signal may be generated internal to the baseband processor 2202 or may be produced by a baseband signal generator 2204. The test signal is representative of a signal produced by the baseband processor 2202 during normal operations, e.g., modulated OFDM, 2-tone sinusoidal, multi-tone sinusoidal, etc. The baseband processor 2202 causes each of a plurality of power amplifier bias settings to be applied to the power amplifier. For each of the plurality of power amplifier bias settings, the power amplifier 2208 produces an amplified test signal. For each of the plurality of power amplifier bias settings, the receiver section 2212 couples back a portion of the amplified test signal to the baseband processor. Coupling back of a portion of the amplified test signal may be caused by a receive/transmit switch 73 or via a signal coupler 2210. For each of the plurality of power amplifier bias settings, the baseband processor 2202 produces a characterization of the amplified test signal. The baseband processor 2202, based upon a plurality of characterizations of the amplified test signal and respective power amplifier bias settings, determines power amplifier bias control settings. Finally, the baseband processor 2202 applies the power amplifier bias control settings to the power amplifier 2208.

Thus, in its operations, the baseband processor 2202 tunes the power amplifier 2208 so its response is linearized to minimize Error Vector Magnitude (EVM) and Intermodulation (IM), e.g., IM3, the third-order intermodulation produce. EVM is a modulation quality metric widely used in digital RF communications systems. As an example, the EVM can be the root-mean-square (rms) value of the error vector over time. Used properly, EVM and related measurements can pinpoint exactly the type of degradations present in a signal and can even help identify their sources.

Figure 23:
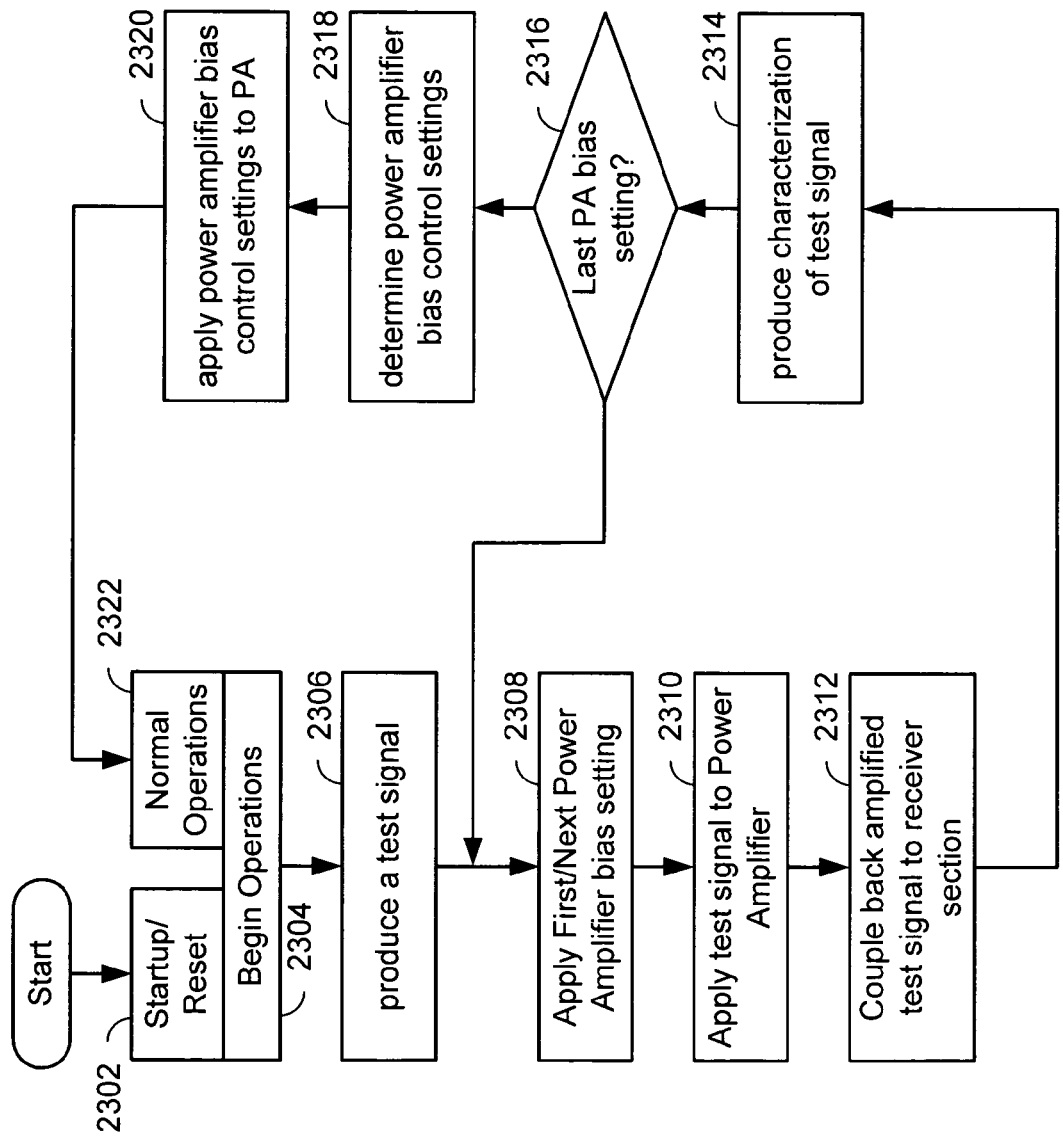
FIG. 23 is a flow chart illustrating operation of a communications transceiver in calibrating and configuring a power amplifier according to the present invention.

FIG. 23 is a flow chart illustrating operation of a communications transceiver in calibrating and configuring a power amplifier according to the present invention. Operation begins from startup/reset (step 2302) wherein calibration/configuration operations commence (step 2304). During power amplifier calibration/configuration operations, the communications transceiver produces a test signal (step 2306). In one embodiment, a baseband signal generator 2204 produces the test signal to a transceiver processing module 2202 that services the communications transceiver. In another embodiment, a baseband processor of the communications transceiver produces the test signal. As the reader will appreciate with reference to FIG. 2, the test signal may be digitally produced, converted to an analog signal, up converted to a transmit frequency band, and provided to the power amplifier for amplification.

Operation continues into a calibration phase, during which the power amplifier's performance are characterized for each of a plurality of power amplifier bias settings. A first (next) power amplifier bias setting is applied to the power amplifier (step 2308). With the respective power amplifier power amplifier bias setting applied to the power amplifier, the test signal is applied signal to the power amplifier to produce an amplified test signal (step 2310). The test signal may be representative of a modulated signal that the communications transceiver produces during normal operations. Thus, the amplified test signal is produced in a transmit frequency band corresponding to the communications transceiver. The power amplifier operates upon the test signal to simulate its actual operations.

A portion of the amplified test signal is coupled back to a receiver section of the communications transceiver (step 2312). The amplified test signal is coupled back through receiver components, as illustrated in FIGS. 2 and/or 22, and applied to the transceiver processing module 2202, e.g., baseband processor. In coupling back the portion of the amplified test signal to the receiver section the power level of the portion coupled back must correspond to the power handling capabilities of the receiver path components. The transceiver processing module 2202 then produces a characterization of the amplified test signal respective to the corresponding power amplifier bias setting. The characterization of the amplified test signal may indicate at least one of an error vector magnitude, an intermodulation product magnitude, or the 1 dB compression point of the amplified test signal.

Next, the transceiver processing module 2202 (or another component) determines whether the current power amplifier bias setting is the last to be considered for calibration operations (step 2316). If not, operation returns to step 2308 where a next power amplifier bias setting is applied to the power amplifier. If so, operation continues to step 2318 where the transceiver processing module 2202 (or another component), based upon a plurality of characterizations of the amplified test signal and respective power amplifier bias settings, determines power amplifier bias control settings. The transceiver processing module 2202 (or another component) then applies the power amplifier bias control settings to the power amplifier (step 2320). Normal operations (step 2322) for the power amplifier of the communications transceiver continue until power amplifier calibration operations are again performed, which may be at idle periods of the communications transceiver.

As one of average skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A method for calibrating a power amplifier that services a communications transceiver, the method comprising:
   producing a test signal to test the power amplifier, wherein the power amplifier has a primary transconductance stage, a secondary transconductance stage, a cascode stage and an inductive load, in which a primary bias setting is coupled to the primary transconductance stage and a secondary bias setting is coupled to the secondary transconductance stage;

applying the test signal to calibrate the bias settings by:
(i) applying a first bias voltage to a gate of a metal oxide silicon transistor of the cascode stage and applying a second bias voltage to a base of a parasitic bipolar transistor formed in parallel with the metal oxide silicon transistor;
(ii) applying a respective bias setting to the primary and secondary transconductance stages of the power amplifier;
(iii) applying the test signal to the power amplifier to produce an amplified test signal;
(iv) coupling back a portion of the amplified test signal to a receiver section of the communications transceiver;
(v) producing a characterization of the amplified test signal, wherein the characterization indicates at least one of an error vector magnitude, intermodulation product magnitude, or 1 dB compression point of the amplified test signal;
(vi) repeating (i) through (v) for respective set of bias settings, until a plurality of bias settings have been tested; and determining power amplifier bias control settings to operate the power amplifier, based upon the plurality of characterizations of the amplified test signal and the respective set of bias settings, so that the power amplifier has its response linearized to minimize error vector magnitude and intermodulation product magnitude; and applying the power amplifier bias control settings to the power amplifier.

2. The method of claim 1, wherein the power amplifier bias control settings are determined during at least one of start up, reset, and idle periods of the communications transceiver.

3. The method of claim 1, wherein the power amplifier bias control settings include at least one of a minimum bias setting and a maximum bias setting.

4. The method of claim 1, wherein the power amplifier bias control settings include a relationship between input signal level and applied bias level.

5. The method of claim 1, wherein the power amplifier bias control settings include a minimum bias setting, a maximum bias setting, and a relationship between input signal level and applied bias level.

6. The method of claim 1, wherein in some operations the metal oxide silicon transistor is turned off by a particular setting of the first bias voltage.

7. The method of claim 1, wherein in some operations the parasitic bipolar transistor is turned off by a particular setting of the second bias voltage.

8. The method of claim 1, wherein in some operations the metal oxide silicon transistor is turned on by the first bias voltage and the parasitic bipolar transistor is turned on by the second bias voltage.

9. A communications transceiver comprising:
a baseband processor;
a receiver section coupled to the baseband processor;
a transmitter section coupled to the baseband processor that includes a power amplifier, wherein the power amplifier has a primary transconductance stage, a secondary transconductance stage, a cascode stage and an inductive load, in which a primary bias setting is coupled to the primary transconductance stage and a secondary bias setting is coupled to the secondary transconductance stage; and wherein in a calibration operation:
(i) the baseband processor produces a test signal to the transmitter section;
(ii) the baseband processor causes a first bias voltage to be applied to a gate of a metal oxide silicon transistor of the cascode stage and a second bias voltage to be applied to a base of a parasitic bipolar transistor formed in parallel with the metal oxide silicon transistor;
(iii) the baseband processor causes a respective bias setting to be applied to the primary and secondary transconductance stages of the power amplifier:
(iv) for the respective bias setting, the power amplifier produces an amplified test signal;
(v) for the respective bias setting, the receiver section couples back a portion of the amplified test signal to the baseband processor;
(vi) for the respective bias setting, the baseband processor produces a characterization of the amplified test signal, wherein the characterization indicates at least one of an error vector magnitude, intermodulation product magnitude, or 1 dB compression point of the amplified test signal;
(vii) the baseband processor repeats (ii) through (v) for respective set of bias settings, until a plurality of bias settings have been tested; and
(viii) the baseband processor, based upon a plurality of characterizations of the amplified test signal and the respective set of power amplifier bias settings, determines power amplifier bias control settings, so that the power amplifier has its response linearized to minimize error vector magnitude and intermodulation product magnitude; and
the baseband processor to apply the power amplifier bias control settings to the power amplifier.

10. The communications transceiver of claim 9, wherein the power amplifier bias control settings are determined during at least one of start up, reset, and idle periods of the communications transceiver.

11. The communications transceiver of claim 9, wherein the power amplifier bias control settings include at least one of a minimum bias setting and a maximum bias setting.

12. The communications transceiver of claim 9, wherein the power amplifier bias control settings include a relationship between input signal level and applied bias level.

13. The communications transceiver of claim 9, wherein the power amplifier bias control settings include a minimum bias setting, a maximum bias setting, and a relationship between input signal level and applied bias level.

14. The communications transceiver of claim 9, wherein in some operations the metal oxide silicon transistor is turned off by a particular setting of the first bias voltage.

15. The communications transceiver of claim 9, wherein in some operations the parasitic bipolar transistor is turned off by a particular setting of the second bias voltage.

16. The communications transceiver of claim 9, wherein in some operations the metal oxide silicon transistor is turned on by the first bias voltage and the parasitic bipolar transistor is turned on by the second bias voltage.

17. The communications transceiver of claim 9, further comprising a baseband signal generator that produces the test signal.

18. The communications transceiver of claim 9, wherein the test signal is representative of a modulated signal to be produced by the communications transceiver during normal operations.

* * * * *

UNITED STATES PATENT AND TRADEMARK OFFICE
CERTIFICATE OF CORRECTION

PATENT NO. : 7,421,254 B2  Page 1 of 1
APPLICATION NO. : 10/819016
DATED : September 2, 2008
INVENTOR(S) : Arya Reza Behzad It is certified that error appears in the above-identified patent and that said Letters Patent is hereby corrected as shown below:

Column 9, line 57: replace "5O4a" with --504a--.

Column 9, line 62: replace "5O4a" with --504a--.

Signed and Sealed this

Seventeenth Day of March, 2009

JOHN DOLL
*Acting Director of the United States Patent and Trademark Office*